(12) United States Patent
Khaderbad et al.

(10) Patent No.: US 12,166,079 B2
(45) Date of Patent: Dec. 10, 2024

(54) 2D CHANNEL TRANSISTORS WITH LOW CONTACT RESISTANCE

(71) Applicant: Taiwan Semiconductor Manufacturing Co., Ltd., Hsinchu (TW)

(72) Inventors: Mrunal Abhijith Khaderbad, Hsinchu (TW); Dhanyakumar Mahaveer Sathaiya, Hsinchu (TW); Wei-Yen Woon, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 318 days.

(21) Appl. No.: 17/455,146

(22) Filed: Nov. 16, 2021

(65) Prior Publication Data
US 2022/0293736 A1 Sep. 15, 2022

Related U.S. Application Data

(60) Provisional application No. 63/159,825, filed on Mar. 11, 2021.

(51) Int. Cl.
| | | |
|---|---|---|
| *H01L 29/10* | (2006.01) | |
| *H01L 29/24* | (2006.01) | |
| *H01L 29/40* | (2006.01) | |
| *H01L 29/417* | (2006.01) | |

(52) U.S. Cl.
CPC .......... *H01L 29/1054* (2013.01); *H01L 29/24* (2013.01); *H01L 29/401* (2013.01); *H01L 29/41775* (2013.01)

(58) Field of Classification Search
CPC .......... H01L 29/66969; H01L 29/7896; H01L 29/778; H01L 29/78681
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |

(Continued)

*Primary Examiner* — Vincent Wall
(74) *Attorney, Agent, or Firm* — Sterne, Kessler, Goldstein & Fox P.L.L.C.

(57) ABSTRACT

The present disclosure describes a 2D channel FET with low contact resistance and a method for forming such a structure. The method includes depositing a dielectric layer on a semiconductor substrate, depositing a metal layer on the dielectric layer, and depositing a hard mask layer on the metal layer. The method further includes forming a gate opening by removing a portion of the hard mask layer and a portion of the metal layer. The method further includes depositing a spacer material layer on sidewalls of the gate opening and forming a channel, the channel including a TMC layer, at a bottom of the gate opening. The method further includes forming a gate structure on the channel and in the gate opening and removing the hard mask layer.

20 Claims, 23 Drawing Sheets

(56) References Cited

U.S. PATENT DOCUMENTS

| | | | |
|---|---|---|---|
| 10,643,904 B2* | 5/2020 | Xie | H01L 29/4966 |
| 2011/0147795 A1* | 6/2011 | Rachmady | H01L 29/78 |
| | | | 438/285 |
| 2013/0193412 A1* | 8/2013 | Lee | H01L 29/66787 |
| | | | 977/734 |
| 2013/0277644 A1* | 10/2013 | Seo | H01L 29/42376 |
| | | | 257/29 |
| 2015/0243773 A1* | 8/2015 | Basu | H01L 29/205 |
| | | | 257/194 |
| 2015/0303299 A1* | 10/2015 | Chang | H01L 21/02568 |
| | | | 257/29 |
| 2016/0118479 A1* | 4/2016 | Chang | H01L 29/66742 |
| | | | 438/156 |
| 2016/0204207 A1* | 7/2016 | Then | H01L 29/0673 |
| | | | 438/285 |
| 2017/0059514 A1* | 3/2017 | Hoffman | G01N 33/5438 |
| 2017/0194378 A1* | 7/2017 | Kim | H10B 63/30 |
| 2018/0323289 A1* | 11/2018 | Zhang | H10B 41/27 |
| 2018/0342518 A1* | 11/2018 | Kim | H01L 21/76224 |
| 2022/0293736 A1* | 9/2022 | Khaderbad | H01L 29/66969 |
| 2024/0006521 A1* | 1/2024 | Lin | H01L 29/78391 |

* cited by examiner

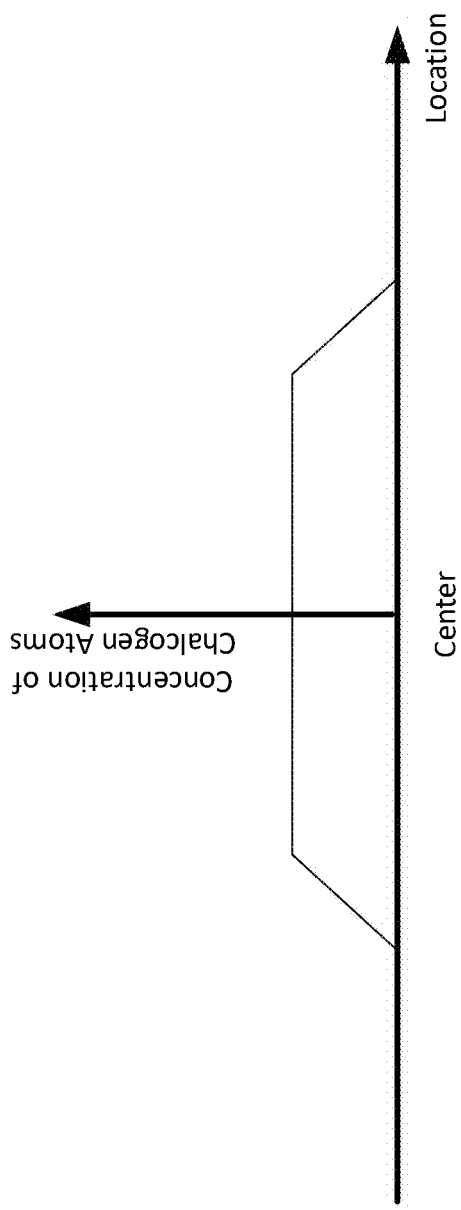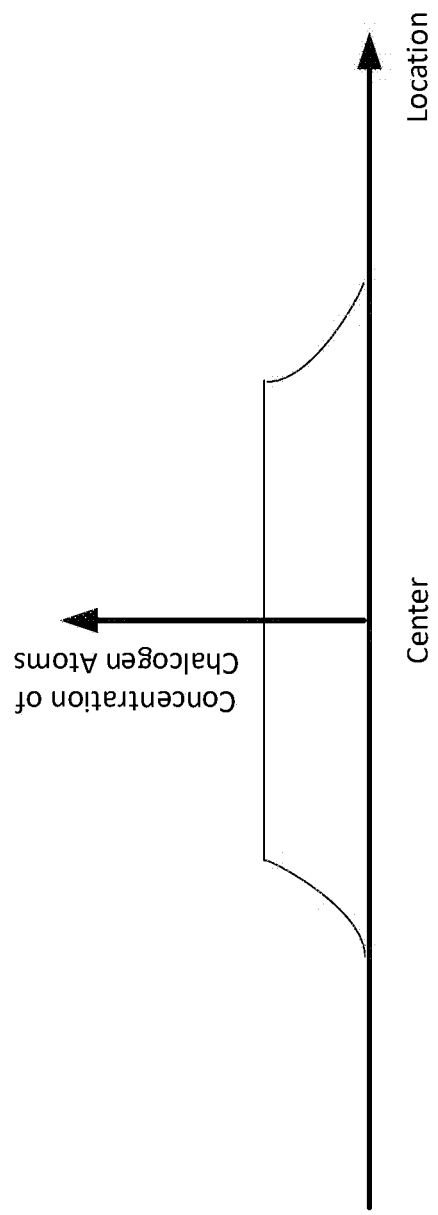

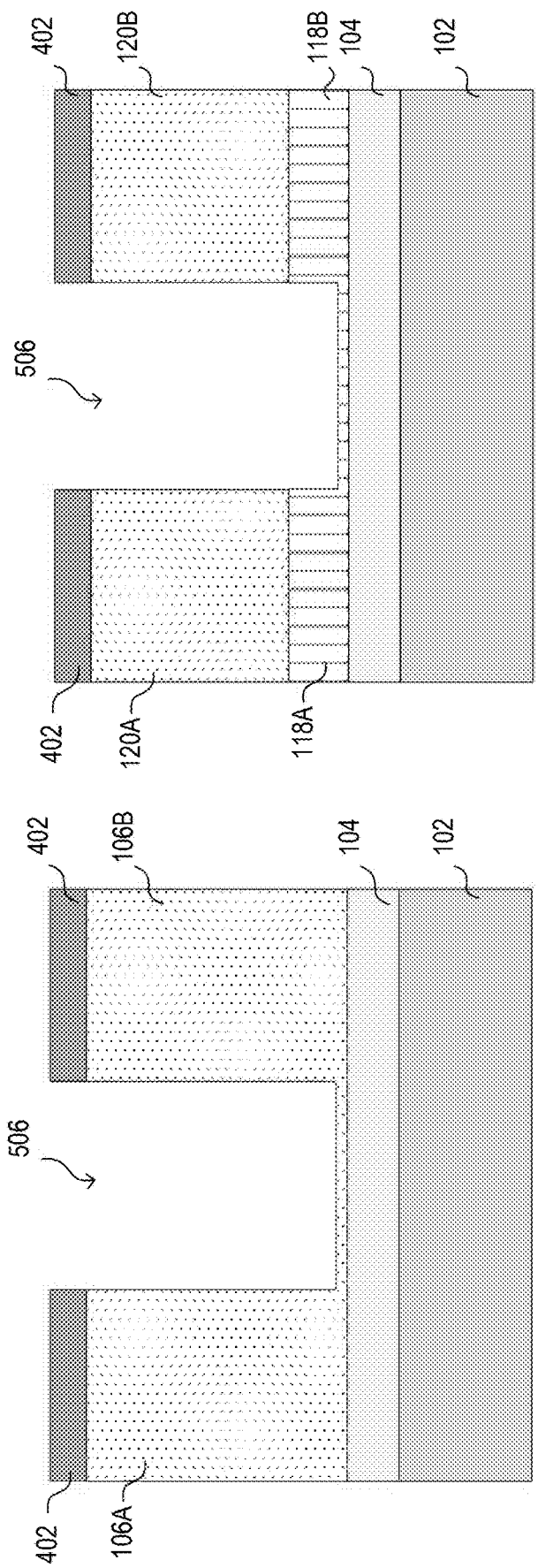

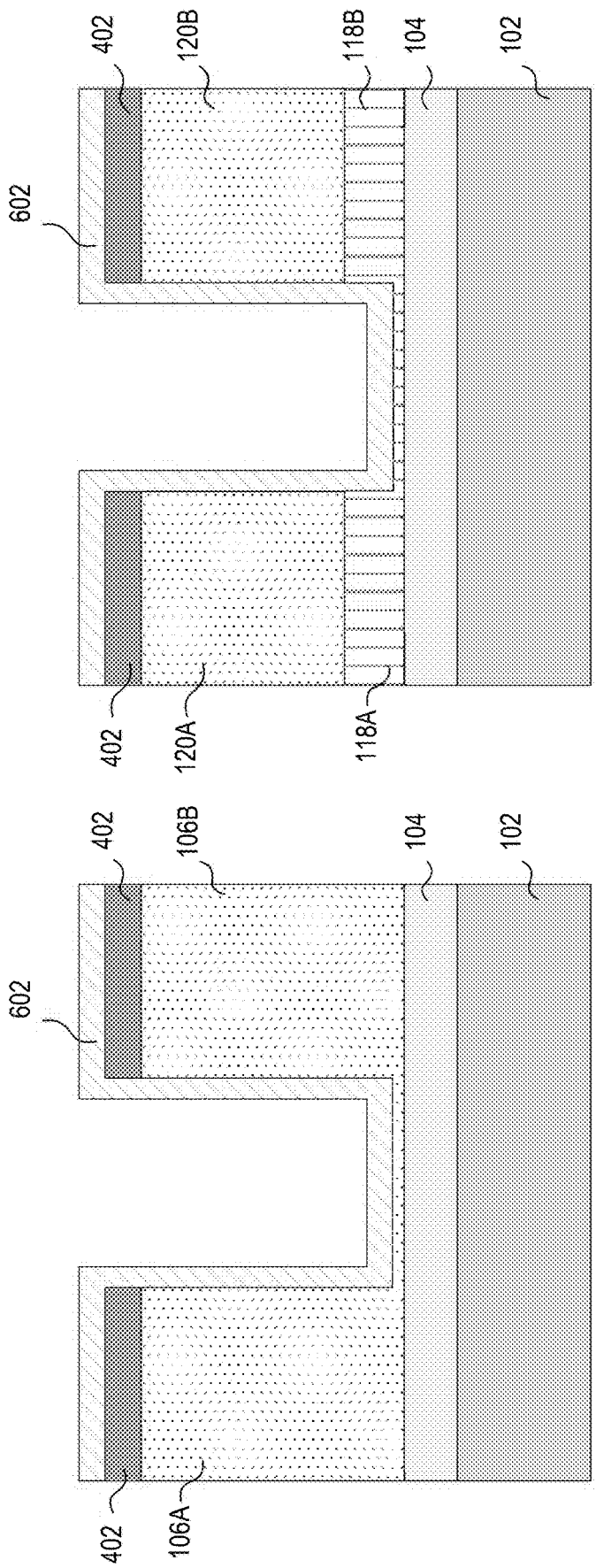

2D CHANNEL TRANSISTORS WITH LOW CONTACT RESISTANCE

CROSS-REFERENCE TO RELATED APPLICATION

This application claims the benefit of U.S. Provisional Patent Application No. 63/159,825, filed on Mar. 11, 2021 and titled "2D Channel FET with Ultra-Low Contact Resistance," the disclosure of which is incorporated by reference herein in its entirety.

BACKGROUND

Two-dimensional (2D) channel field-effect transistors (FETs) are advantageous with better short channel effects (SCE) but lack good source/drain (S/D) contact schemes. Low contact area at edge interfaces and van der Waals gap between top and bottom interfaces give rise to high contact resistance. High Schottky barrier height (SBH) between the S/D regions and the 2D channel also contributes to the high contact resistance. It is challenging to find suitable materials and integration processes for the 2D channel to have low contact resistance.

BRIEF DESCRIPTION OF THE DRAWINGS

Aspects of the present disclosure are best understood from the following detailed description when read with the accompanying figures.

FIGS. 1D and 1E illustrate concentration profiles in a 2D channel FET, in accordance with some embodiments.

FIGS. 3A-3B, 4A-4B, 5A-5C, 6A-6C, 7A-7D, 8A-8C, 9A-9C, 10A-10C, 11A-11C, and 12A-12C illustrate cross-sectional views of a 2D channel FET at various stages of its fabrication process, in accordance with some embodiments.

DETAILED DESCRIPTION

Figure 1A:
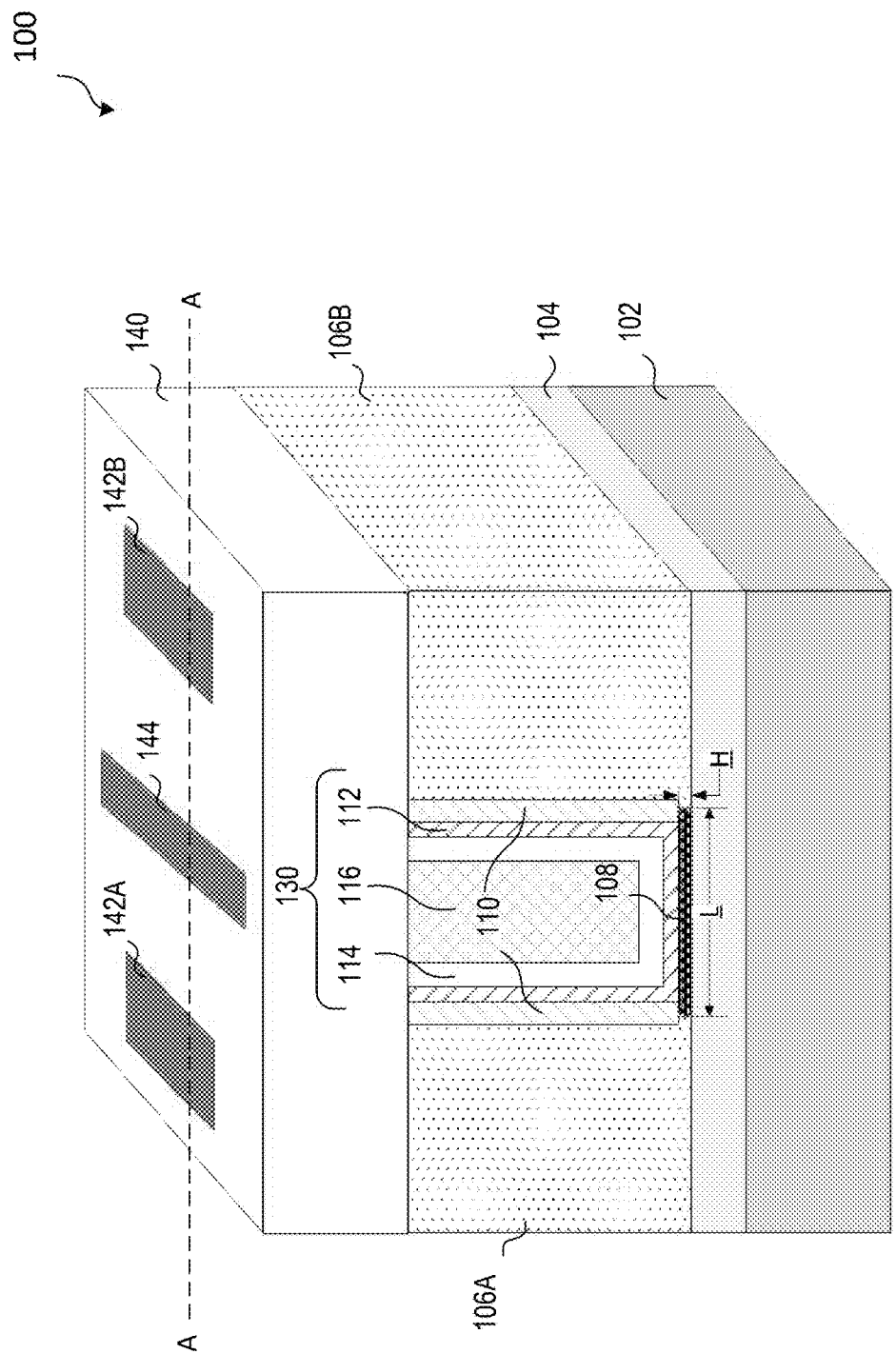
FIGS. 1A, 1B, and 1C illustrate isometric views of a 2D channel FET, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows can include embodiments in which the first and second features are formed in direct contact, and can also include embodiments in which additional features can be formed between the first and second features, such that the first and second features cannot be in direct contact. As used herein, the formation of a first feature on a second feature means the first feature is formed in direct contact with the second feature. In addition, the present disclosure can repeat reference numerals and/or letters in the various examples. This repetition does not in itself dictate a relationship between the embodiments and/or configurations discussed herein.

Spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein can likewise be interpreted accordingly.

It is noted that references in the specification to "one embodiment," "an embodiment," "an example embodiment," "exemplary," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A-1C, 3A-3B, 4A-4B, 5A-5C, 6A-6C, 7A-7D, 8A-8C, 9A-9C, 10A-10C, 11A-11C, and 12A-12C with the same annotations applies to each other, unless mentioned otherwise.

In semiconductor field, a two-dimensional (2D) channel can have two dimensions outside the nanoscale and one dimension with only single- or few-layer atoms. The dimensions of the 2D channel make it differ from 3D channels. 2D channel field effect transistors (FETs) are advantageous with better short channel effects (SCEs) but lack good contact with source/drain (S/D) regions (also referred to as "S/D contacts" when S/D regions include metallic material). In a sub-nanometer 2D channel, the contact area between the 2D channel and the S/D regions is very low. There is a high van der Waals gap between the top and bottom surfaces of the 2D channel. There is also a high Schottky barrier height (SBH) between the S/D regions and the 2D channel. All these factors give rise to a high contact resistance in the 2D channel FETs.

The present disclosure provides example 2D channel FETs with low contact resistance between S/D regions and 2D channels, and a method for forming such FETs using a channel last process. The channel last process means the channel is formed after the S/D regions are formed. In some embodiments, a gate opening is formed through a transition metal layer, e.g., titanium (Ti), tungsten (W), or molybdenum (Mo), leaving a thin metal layer at the bottom of the gate opening. The thin metal layer is treated with a chalcogen material, e.g., sulfur (S), selenium (Se), or tellurium (Te), to form a transition metal chalcogenide (TMC) material-based 2D channel. The chalcogen treatment can generate a high mobility channel in the center of the 2D channel. The chalcogen treatment can generate lightly doped drains (LDDs) under S/D regions. The chalcogen treatment can further generate a gradient distribution of the TMC material at the two ends of the 2D channel. The gradient distribution can realize a semiconductor-semimetal-metal work function (WF) transition from the 2D channel to the S/D regions. The transition can reduce SBH, i.e., SBH tuning, between the 2D channel and the S/D regions to result in low contact resistance. The diffusion of chalcogen atoms into the thin metal layer can also reduce the van der Waals gap between the top and bottom surfaces of the 2D channel, and further reduce the contact resistance.

In some embodiments, the gate opening is formed with a two-step etching process, leaving a staple-shaped 2D channel. The staple-shaped 2D channel can increase the contact area between the 2D channel and the S/D regions, thus reducing the contact resistance. By using different etching step combinations, the 2D channel can be other shapes, e.g., semicircular, trapezoid, U-shaped, etc.

In some embodiments, the S/D regions can have two layers of metal. The 2D channel can have a gradient contact with the first metal layer resulting in low contact resistance. The metal-metal contact between the first metal layer and the second metal layer does not add to the contact resistance. Using two layers of metal can increase the flexibility in selecting S/D region metal because there may be a limitation on the type of metal that can be treated with chalcogen to form the 2D channel.

Figure 1B:
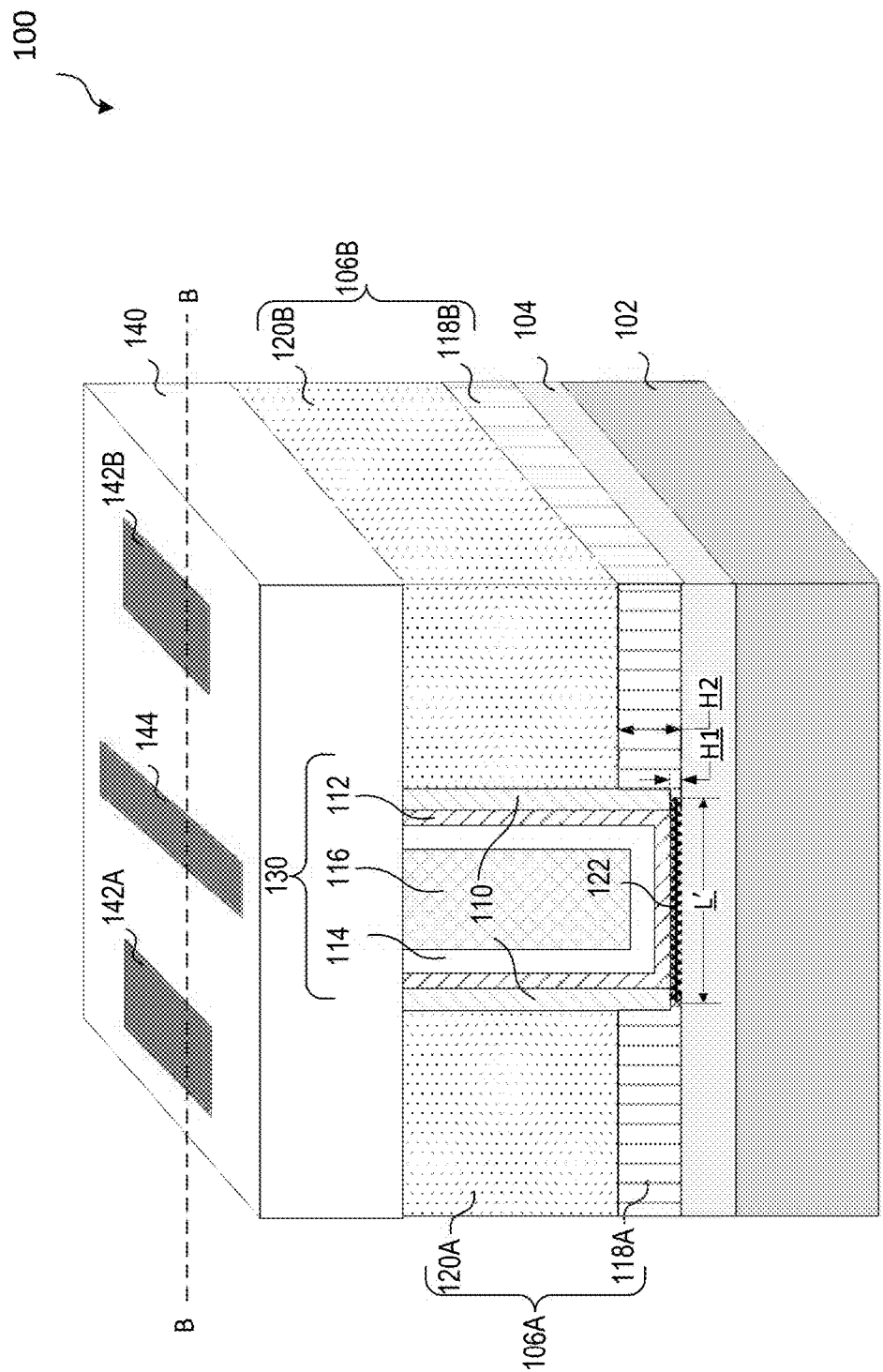
Figure 1C:
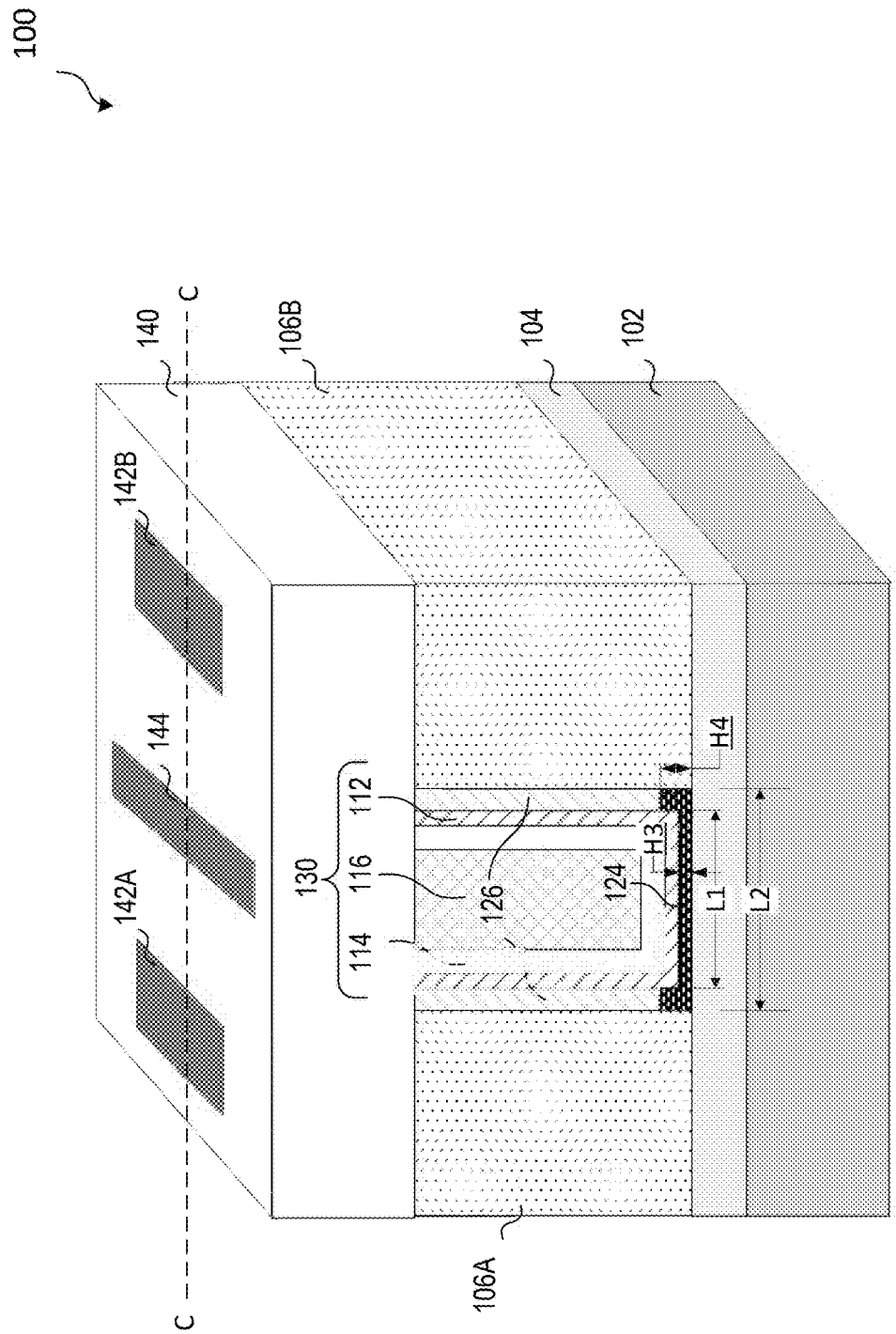

According to some embodiments, FIGS. 1A, 1B, and 1C illustrate different isometric views of a 2D channel FET 100 with low contact resistance. 2D channel FET 100 can include a substrate 102, a dielectric layer 104, S/D regions 106A-106B, spacers 110 or 126, a gate structure 130, a 2D channel 108, 122, or 124, an interlayer dielectric (ILD) layer 140, and contact structures 142A, 142B, and 144. ILD layer 140 can include a dielectric material, such as silicon oxide ($SiO_x$). Gate contract structure 144 and S/D contact structures 142A and 142B can be a suitable conductive metal, such as W, cobalt (Co), aluminum (Al), nickel (Ni), and ruthenium (Ru). The shapes and sizes of contact structures 142A, 142B, and 144 are for illustrative purposes only. As shown in FIG. 1B, S/D regions 106A-106B can include S/D regions 118A-118B and 120A-120B, according to some embodiments. In some embodiments, S/D regions 106A-106B and 120A-120B can also be referred to as S/D contacts 106A-106B and 120A-120B. In other words, S/D contacts 106A-106B and 120A-120B can function as S/D contact structures 142A and 142B, according to some embodiments.

Referring to FIGS. 1A-1C, in some embodiments, substrate 102 can include (i) silicon (Si), (ii) a compound semiconductor such as gallium arsenide (GaAs), gallium phosphide (GaP), indium phosphide (InP), indium arsenide (InAs), and/or indium antimonide (InSb), (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof. In some embodiments, substrate 102 can be an epitaxial material. Further, substrate 102 can be doped with p-type dopants, e.g., boron (B), indium (In), Al, or gallium (Ga), or n-type dopants, e.g., phosphorus (P) or arsenic (As).

Referring to FIGS. 1A-1C, in some embodiments, dielectric layer 104 can include an oxide, such as $SiO_x$ (e.g., buried oxide layer), sapphire, and another suitable dielectric material. Dielectric layer 104 can include spin-on-glass (SOG), silicon nitride (SiN), silicon oxynitride (SiON), fluorine-doped silicate glass (FSG), a low-k dielectric material, and/or other suitable insulating material. By way of example and not limitation, dielectric layer 104 is thinner than substrate 102. Further, dielectric layer 104 can electrically isolate structures formed thereon from substrate 102.

Referring to FIGS. 1A-1C, in some embodiments, S/D regions 106A-106B, 118A-118B, and 120A-120B can include a transition metal, such as W or Mo. Referring to FIG. 1B, in some embodiments, S/D regions 120A-120B can include a suitable conductive material, such as W, Mo, nickle (Ni), bismuth (Bi), scandium (Sc), Ti, Cu, Co, silver (Ag), Al, titanium aluminum nitride (TiAlN), tantalum carbide (TaC), tantalum carbonitride (TaCN), tantalum silicon nitride (TaSiN), manganese (Mn), zirconium (Zr), titanium nitride (TiN), tantalum nitride (TaN), Ru, tungsten nitride (WN), titanium carbide (TiC), titanium aluminum carbide (TiAlC), tantalum aluminum carbide (TaAlC), metal alloys, and/or combinations thereof. The material of S/D regions 118A-118B can be different from the material of S/D regions 120A-120B. The ratio between the thicknesses of S/D regions 118A-118B and the thickness of S/D regions 120A-120B can be between about 0.5 and about 1.0. By way of example and not limitation, S/D regions 118A-118B can be significantly thinner than S/D regions 120A-120B.

Referring to FIGS. 1A-1C, in some embodiments, spacers 110 and 126 can include dielectric materials, such as $SiO_x$, SiN, silicon oxycarbon nitride (SiOCN), silicon carbonitride (SiCN), other suitable insulating materials, or any combination thereof. Spacers 110 has a greater height than spacers 126 by about 1 nm to about 6 nm, such that the staple-shaped 2D channel 124 can be formed under spacers 126.

Referring to FIGS. 1A-1C, in some embodiments, gate structure 130 can be a multi-layered structure. By way of example and not limitation, gate structure 130 can include a gate dielectric layer 112, a work function metal (WFM) layer 114, and a filler metal layer 116. Gate structure 130 can further include an interfacial oxide (IO) layer (not shown in FIGS. 1A-1C). IO layers can include $SiO_x$, silicon germanium oxide ($SiGeO_x$), or germanium oxide ($GeO_x$). Gate dielectric layer 112 can include a high-k (HK) gate dielectric layer. Gate dielectric layer 112 can include an HK dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). WFM layer 114 can include titanium aluminum (TiAl), titanium aluminum carbide (TiAlC), tantalum aluminum (TaAl), tantalum aluminum carbide (TaAlC), Al-doped Ti, Al-doped titanium nitride (TiN), Al-doped tantalum (Ta), Al-doped tantalum nitride (TaN), other suitable Al-based materials, or a combination thereof. In some embodiments, WFM layer 114 can include substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu), and a combination thereof. Filler metal layer 116 can include a suitable conductive material, such as W, Ti, Ag, Ru, Mo, Cu, Co, Al, iridium (Ir), Ni, metal alloys, and a combination thereof. The aspect ratio of gate structure 130 can be between about 4:1 and about 8:1. In some embodiments, the sidewalls of gate structure 130 can have a positive slope. However, this is not limiting, because gate structure 130 can be designed to have substantially vertical sidewalls (e.g., between about 86° and about) 90°, or sidewalls with a negative slope. The corner between the sidewalls and the bottom of gate structure 130 is shown to be straight, but in some embodiments, the corner can be rounded.

Referring to FIGS. 1A-1C, in some embodiments, 2D channels 108, 122, and 124 can include a TMC material, such as a sulfide of any of the transition metals of the periodic table, a selenide of any of the transition metals of the periodic table, a telluride of any of the transition metals of the periodic table, an oxide of any of the transition metals of the periodic table, and a combination thereof. In some embodiments, the TMC material can include tungsten sulfide ($WS_2$), tungsten selenide ($WSe_2$), tungsten telluride ($WTe_2$), molybdenum sulfide ($MoS_2$), molybdenum selenide ($MoSe_2$), molybdenum telluride ($MoTe_2$), $TiS_2$, titanium selenide ($TiSe_2$), titanium telluride ($TiTe_2$), zirconium sulfide ($ZrS_2$), zirconium selenide ($ZrSe_2$), zirconium telluride ($ZrTe_2$), tantalum sulfide ($TaS_2$), tantalum selenide ($TaSe_2$), tantalum telluride ($TaTe_2$), nickel sulfide ($NiS_2$), nickel selenide ($NiSe_2$), nickel telluride ($NiTe_2$), cobalt sulfide ($CoS_2$), cobalt selenide ($CoSe_2$), cobalt telluride ($CoTe_2$), niobium sulfide ($NbS_2$), niobium selenide ($NbSe_2$), niobium telluride ($NbTe_2$), hafnium sulfide ($HfS_2$), hafnium selenide ($HfSe_2$), hafnium telluride ($HfTe_2$), and a combination thereof.

Referring to FIGS. 1A-1C, in some embodiments, 2D channels 108, 122, and 124 can have a composition of $M_xS_y$, $M_xSe_y$, or $M_xTe_y$, where M is a metal including, e.g., W, Mo, Ni, Bi, Sc, or Ti. In some embodiments, x can be about 1.0. In some embodiments, in the center high mobility channel region of 2D channels 108, 122, and 124, y value can be between about 1.9 and about 2.1. According to some embodiments, FIGS. 1D and 1E are concentration profiles of chalcogen atoms in 2D channels 108, 122, and 124. The concentration of the chalcogen atoms can vary from the center of 2D channels 108, 122, and 124, to the edges of 2D channels 108, 122, and 124. At the edges of 2D channels 108, 122, and 124, the atomic concentration can drop from about 1.9 to about 0, e.g., linearly as shown in FIG. 1D or exponentially as shown in FIG. 1E. These examples are not meant to be limiting. In some embodiments, the atomic concentration drop can be a linear decreasing, an exponential decreasing, or other functional decreasing of the atomic concentration. There can be variations of atomic concentration in the center high mobility channel regions of 2D channels 108, 122, and 124. The drop in atomic concentration can start from closer or farther than what is shown in FIGS. 1D and 1E. In some embodiments, there can be no substantial difference in atomic concentrations between center region and edge regions.

Referring to FIGS. 1A-1C, in some embodiments, the atomic concentration drop can start from below spacers 110 or 126 to the ends of 2D channels 108, 122, or 124. In some embodiments, the atomic concentration drop can be from the centerline of the bottom of gate structure 130 to the ends of the bottom of gate structure 130. In some embodiments, the concentration profile of chalcogen atoms in the 2D channel can be uniform. In the Z direction, the chalcogen atoms can have a concentration profile that is decreasing linearly or exponentially from the top surface of 2D channels 108, 122, and 124 to the bottom surface of 2D channels 108, 122, and 124. In some embodiments, the vertical concentration profile can be substantially similar to an ion implantation dopant concentration profile. In some embodiments, 2D channels 108, 122, and 124 can be thin that there is no discernible difference in the concentration profile in the Z direction.

In the XY plane (not shown in FIGS. 1A-1C), there can be localized confinement of 2D channels 108, 122, and 124 at the bottom of gate structure 130. The localized confinement can include a linear distribution. The localized confinement can include a geometric distribution, such as a rectangular, diamond, circular, etc. shape. 2D channels 108, 122, and 124 can have a geometric shape, such as a rectangular, diamond, circular, etc. shape based on a photolithography pattern. In the XZ plane, the concentration profile of chalcogen atoms can be linear, or geometric, such as rectangular, trapezoidal, diamond, elliptical, semi-circular, etc. At the two ends of 2D channels 108, 122, and 124, e.g., below spacers 110 or 126, the concentration profile of chalcogen atoms can have an abrupt cutoff, or a geometric cutoff as the chalcogen atoms diffuses into the metal. The geometric shape can have a radiating, diamond, elliptical, semi-circular, etc. pattern.

Referring to FIGS. 1A-1B, in some embodiments, length L and L' of 2D channels 108 and 122 can be substantially the same as the gate length of gate structure 130, e.g., between about 5 nm and about 100 nm. Referring to FIG. 1A, in some embodiments, height H of 2D channel 108 can be between about 0.7 nm and about 2.8 nm. Referring to FIG. 1B, in some embodiments, height H1 of 2D channel 122 can be between about 0.7 nm and about 2.8 nm. The ratio H1:H2 between height H1 of 2D channel 122 and height H2 of S/D regions 118A-118B can be between about 0.007 and about 0.6. Referring to FIG. 1C, in some embodiments, length L1 of 2D channel 124 can be substantially the same as the gate length of gate structure 130, e.g., between about 5 nm and about 100 nm. Length L2 of 2D channel 124 can be longer than length L1 of 2D channel 124 by about 1 nm to about 20 nm. Height H3 of 2D channel 124 can be between about 0.7 nm and about 2.8 nm. The ratio H3:H4 between height H3 of 2D channel 124 and height H4 of 2D channel 124 can be between about 1.25 and about 2.0. In some embodiments, the corners of 2D channel 124 can be substantially rounded instead of being straight. These dimension ranges and ratios of 2D channels 108, 122, and 124 provide an optimal contact area with low contact resistance between S/D regions 106A-106B and 2D channels 108, 122, and 124, and between S/D regions 118A-118B and 2D channels 108, 122, and 124 without compromising device size and manufacturing cost.

Though 2D channel FET 100 with low contact resistance are described with metal S/D regions in reference to FIGS. 1A-1C, S/D regions can include a metal oxide or a metal nitride. 2D channels 108, 122, and 124 can also be used in planar, finFET, gate-all-around (GAA) FETs, or nanosheet (NS) devices.

Figure 2:
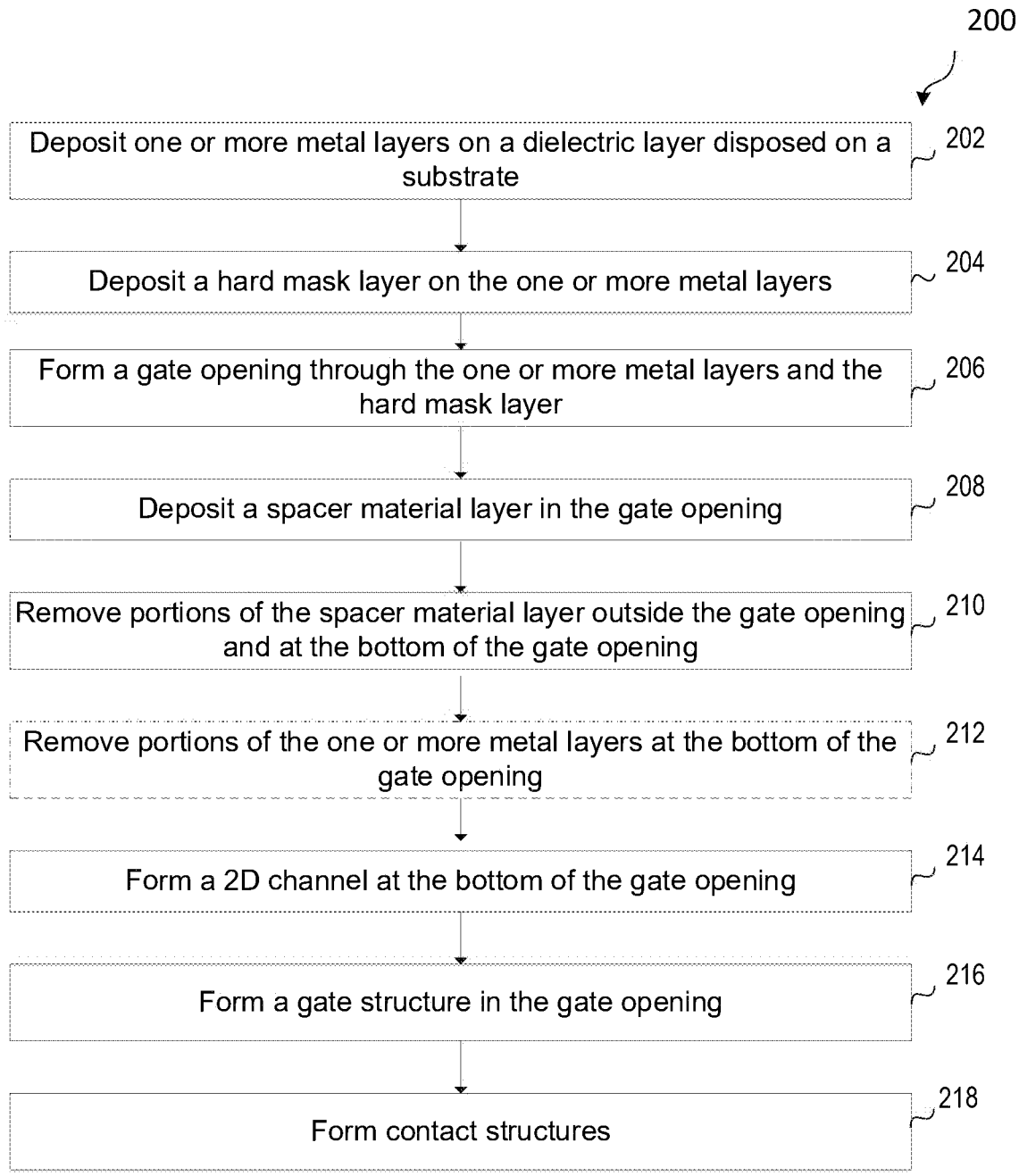
FIG. 2 is a flow diagram of a method for fabricating a 2D channel FET, in accordance with some embodiments.

According to some embodiments, FIG. 2 is a flow chart describing methods for fabricating 2D channel FET 100 with different isometric views, as shown in FIGS. 1A-1C. For illustrative purposes, the operations illustrated in FIG. 2 will be described with reference to the example fabrication process for fabricating 2D channel FET 100 (with different isometric views, as shown in FIGS. 1A-1C) as illustrated in FIGS. 3A-3B, 4A-4B, 5A-5C, 6A-6C, 7A-7D, 8A-8C, 9A-9C, 10A-10C, 11A-11C, and 12A-12C. FIGS. 3A-12A are cross-sectional views of 2D channel FET 100 along line A-A at various stages of fabricating 2D channel FET 100 with the isometric view shown in FIG. 1A, according to some embodiments. FIGS. 3B-12B are cross-sectional views of 2D channel FET 100 along line B-B at various stages of fabricating 2D channel FET 100 with the isometric view shown in FIG. 1B, according to some embodiments. FIGS. 3A-4A, 5C-6C, 7C-7D, and 8C-12C are cross-sectional views of 2D channel FET 100 along line C-C at various stages of fabricating 2D channel FET 100 with the isometric view shown in FIG. 1C, according to some embodiments. Additional fabrication operations can be performed between the various operations of method 200 and can be omitted for simplicity. These additional fabrication operations are within the spirit and the scope of this disclosure. Moreover, not all operations may be required to perform the disclosure provided herein. Additionally, some of the operations can be performed simultaneously, or in a different order than the ones shown in FIG. 2. It should be noted that method 200 may not produce a complete 2D channel FET 100. Accordingly, it is understood that additional processes can be provided before, during, and after method 200, and that some other processes may only be briefly described herein. Elements in FIGS. 3A-3B, 4A-4B, 5A-5C, 6A-6C, 7A-7D, 8A-8C, 9A-9C, 10A-10C, 11A-11C, and 12A-12C with the same annotations as elements in FIGS. 1A-1C are described above.

Figure 3A:
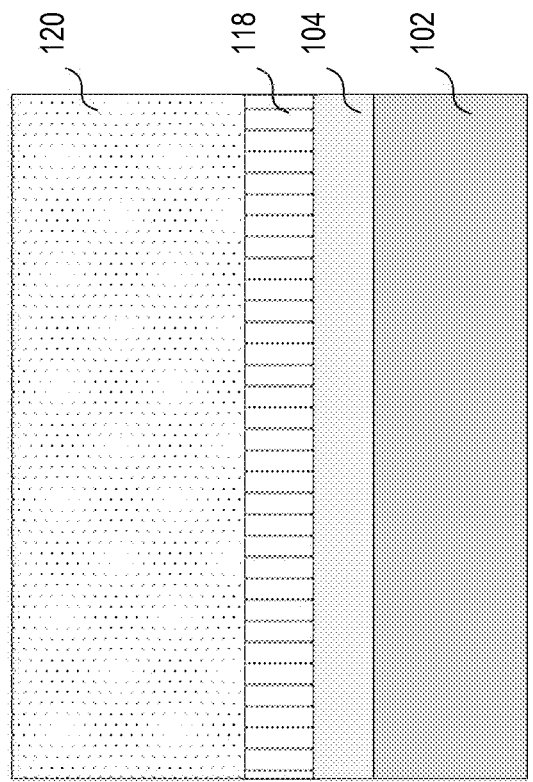
Figure 3B:
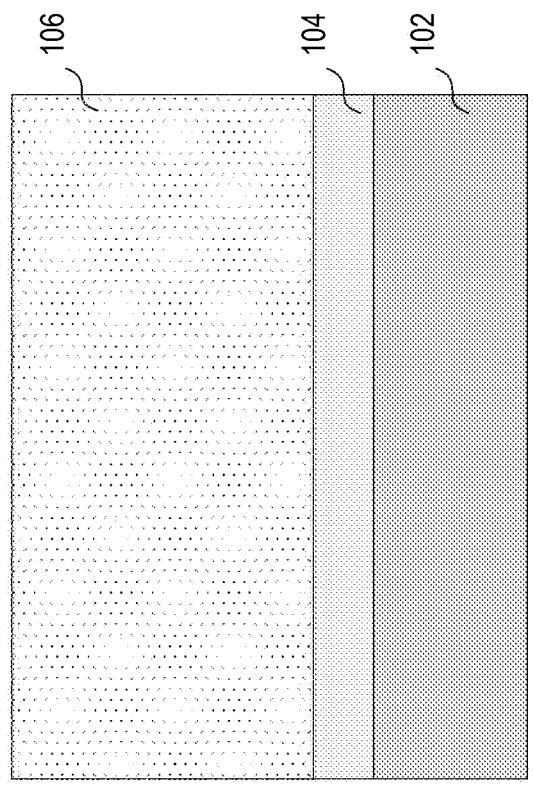

Referring to FIG. 2, in operation 202, one or more metal layers are deposited on a dielectric layer disposed on a substrate. For example, as shown in FIG. 3A, one metal layer 106 is deposited on dielectric layer 104 disposed on substrate 102. For example, as shown in FIG. 3B, two metal layers 118 and 120 are deposited on dielectric layer 104 disposed on substrate 102. Dielectric layer 104 can be deposited on substrate 102 by chemical vapor deposition (CVD), flowable CVD, or plasma-enhanced chemical vapor deposition (PECVD). Other fabrication techniques for dielectric layer 104 are possible. By way of example and not limitation, dielectric layer 104 can be initially blanket deposited over substrate 102, and subsequently planarized using a chemical mechanical polishing (CMP) process so that the top surface of dielectric layer 104 is substantially planar. Metal layer 106, 118, and 120 can be deposited on dielectric layer 104 by sputtering, physical vapor deposition (PVD), CVD, PECVD, or metal-organic chemical vapor deposition (MOCVD). Other fabrication techniques for metal layer 106, 118, and 120 are possible. Metal layer 106, 118, and 120 form S/D regions 106A-106B, 118A-118B, and 120A-120B in subsequent processing. Two different metal layers 118 and 120 can increase flexibility of S/D regions because there may be a limitation on what metal can be used in forming a TMC material.

Figure 4B:
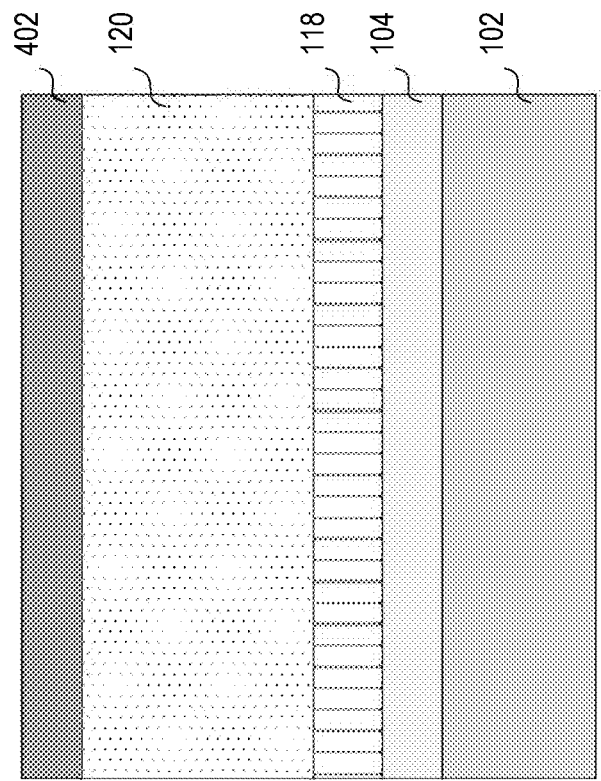
Figure 4B:
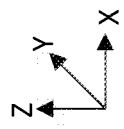
Figure 4A:
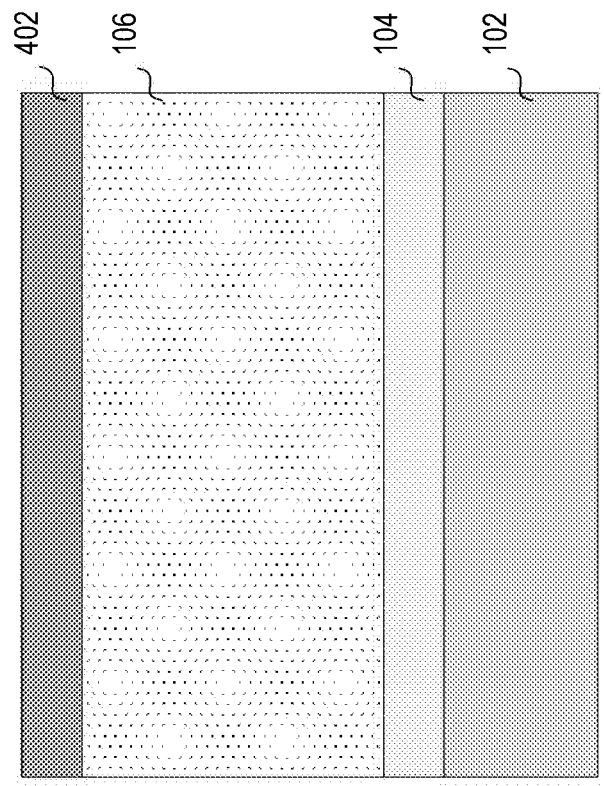
Figure 4A:
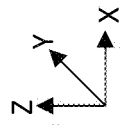

Referring to FIG. 2, in operation 204, a hard mask layer is deposited on the one or more metal layers. If there are more than one metal layer, the hard mask layer is deposited on the top metal layer. For example, as shown in FIGS. 4A-4B, in some embodiments, hard mask layers 402 are deposited on metal layers 106 and 120. Hard mask layer 402 can include a metal oxide ($MO_x$), a metal nitride ($MN_x$), a metal carbide ($MC_x$), a metalaluminate ($MAl_yO_y$), a combination of metal oxides ($M1O_x/M2O_x$), a metal-silicate ($MSiO_x$), or combinations thereof. In some embodiments, the metal in the above-mentioned materials is a transition metal, e.g., hafnium (Hf), Zr, Ti, or Al, a rare earth metal, e.g., yttrium (Y), ytterbium (Yb), or erbium (Er), or combinations thereof. By way of example and not limitation, hard mask layer 402 can include zirconium oxide ($ZrO_x$). In some embodiments, hard mask layer 402 can include zirconium-aluminum oxide (ZrAlO) with an Al concentration between about 10 atomic percent ("at. %") and about 25 at. %. In some embodiments, hard mask layer 402 can include alternating layers of the aforementioned $ZrO_x$ and ZrAlO layers. In some embodiments, hard mask layer 402 can be deposited by thermal or plasma atomic layer deposition (ALD) methods. Alternative deposition methods, e.g., CVD, can be used as long as these alternative deposition methods offer sufficient control over the film thickness and particle generation during the deposition process. In some embodiments, hard mask layer 402 can be resistive to chemical and physical processes, and can protect top surfaces of S/D regions 106A-106B and 120A-120B from subsequent chalcogen treatment. By way of example and not limitation, hard mask layer 402 can be significantly thinner than metal layers 106, 118, and 120.

Figure 5C:
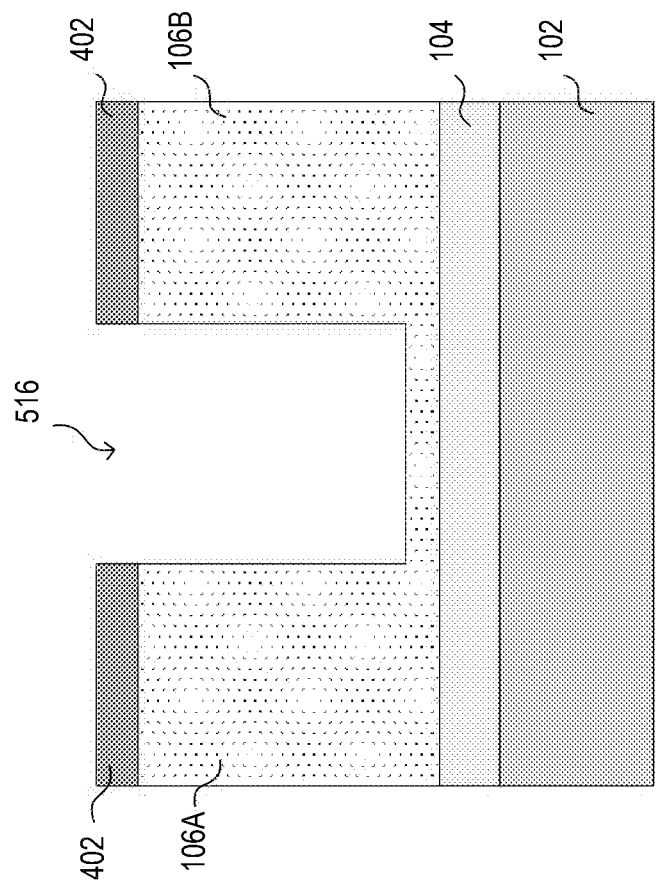

Referring to FIG. 2, in operation 206, a gate opening is formed through the one or more metal layers and the hard mask layer. For example, as shown in FIG. 5A, in some embodiments, gate opening 506 is formed through metal layer 106 and hard mask layer 402. For example, as shown in FIG. 5B, in some embodiments, gate opening 506 is formed through metal layers 118 and 120, and hard mask layer 402. For example, as shown in FIG. 5C, in some embodiments, gate opening 516 is formed through metal layer 106 and hard mask layer 402. Gate opening 516 can be shallower than gate opening 506 such that a second etch can etch back metal layer 106 in gate opening 516.

Gate openings 506 and 516 can be formed by patterned photoresist (not shown in FIGS. 5A-5C). Photoresist layer can be patterned so that patterned photoresist structures are formed over hard mask layer 402. Patterning of the photoresist layer can be accomplished by exposing the photoresist layer to UV or EUV light through a reticle (e.g., a photomask) and subsequently removing unexposed (or exposed portions) of the photoresist layer. The pitch (e.g., spacing) of the patterned photoresist structures can vary depending on the pattern design. Therefore, high and low density areas of the patterned photoresist structures (e.g., patterned photoresist structures with different pitch or spacing) can be formed over different areas of hard mask layer 402. Hard mask layer 402 can be protected from the etching chemistries because the photoresist layer functions as an etch mask.

A dry etch process can remove hard mask layer 402, and metal layers 106, 118, and 120 between the patterned photoresist structures to form gate openings 506 and 516. In other words, the patterned photoresist structures can be used as an etch mask to define the geometrical aspects of gate openings 506 and 516. For example, the width and the pitch of the patterned photoresist structures can be used to further define the width and the pitch of the resulting gate openings 506 and 516. The sidewall slope (or sidewall angle) of gate openings 506 and 516 can be tuned by the dry etch process conditions. Therefore, the dry etch process conditions can be adjusted to achieve the desired slope for the sidewalls of gate openings 506 and 516. In some embodiments, the dry etch process can include several etch sub-steps with a different etch chemistry for each sub-step. After gate openings 506 and 516 is formed, the patterned photoresist structures can be removed with a wet clean process (e.g., wet strip).

The dry etch process (e.g., reactive ion etching process) can use a gas mixture having fluorocarbon ($C_xF_y$), nitrogen ($N_2$), and argon (Ar). The gas mixture can have about 10% to about 70% $C_xF_y$. Gate openings 506 and 516 can be formed by a wet etch process, additionally and/or alternatively. The wet etch process can include a diluted solution of hydrofluoric acid (HF) with a buffer, such as ammonium fluoride ($NH_4F$), diluted HF (HF/H2O), phosphoric acid ($H_3PO_4$), sulfuric acid with deionized water ($H_2SO_4/H_2O$), or any combinations thereof. The etching process can be a selective etch or a timed etch such that a thin metal layer at the bottom of gate openings 506 and 516 can be formed.

Figure 6C:
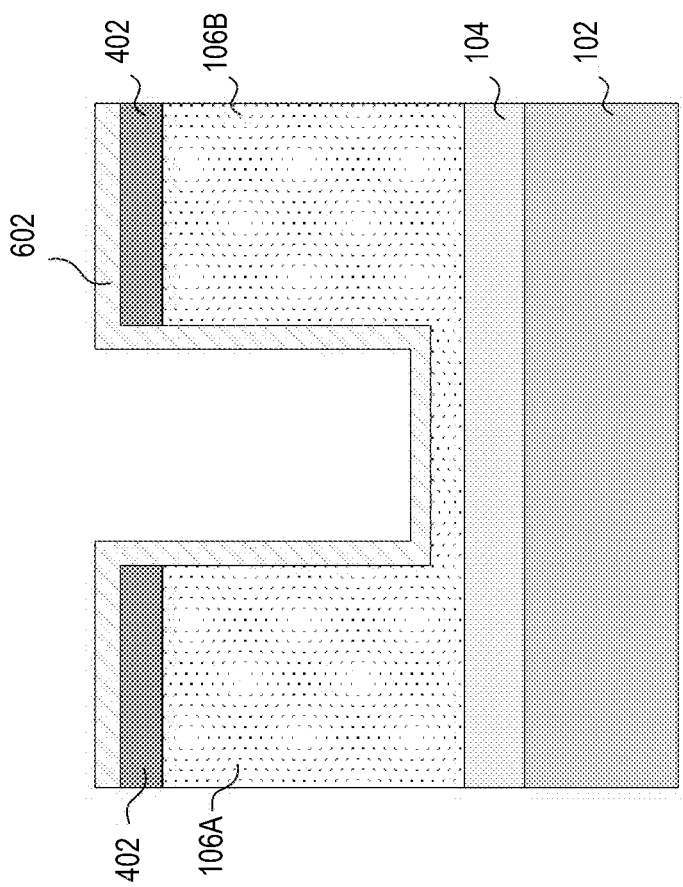

Referring to FIG. 2, in operation 208, a spacer material layer is deposited in the gate opening. For example, as shown in FIGS. 6A-6C, in some embodiments, spacer material layers 602 are disposed in gate openings 506 and 516. Spacer material layer 602 can be deposited with a PECVD process. Other applicable deposition processes can also be used.

Figures 7A, 7B:
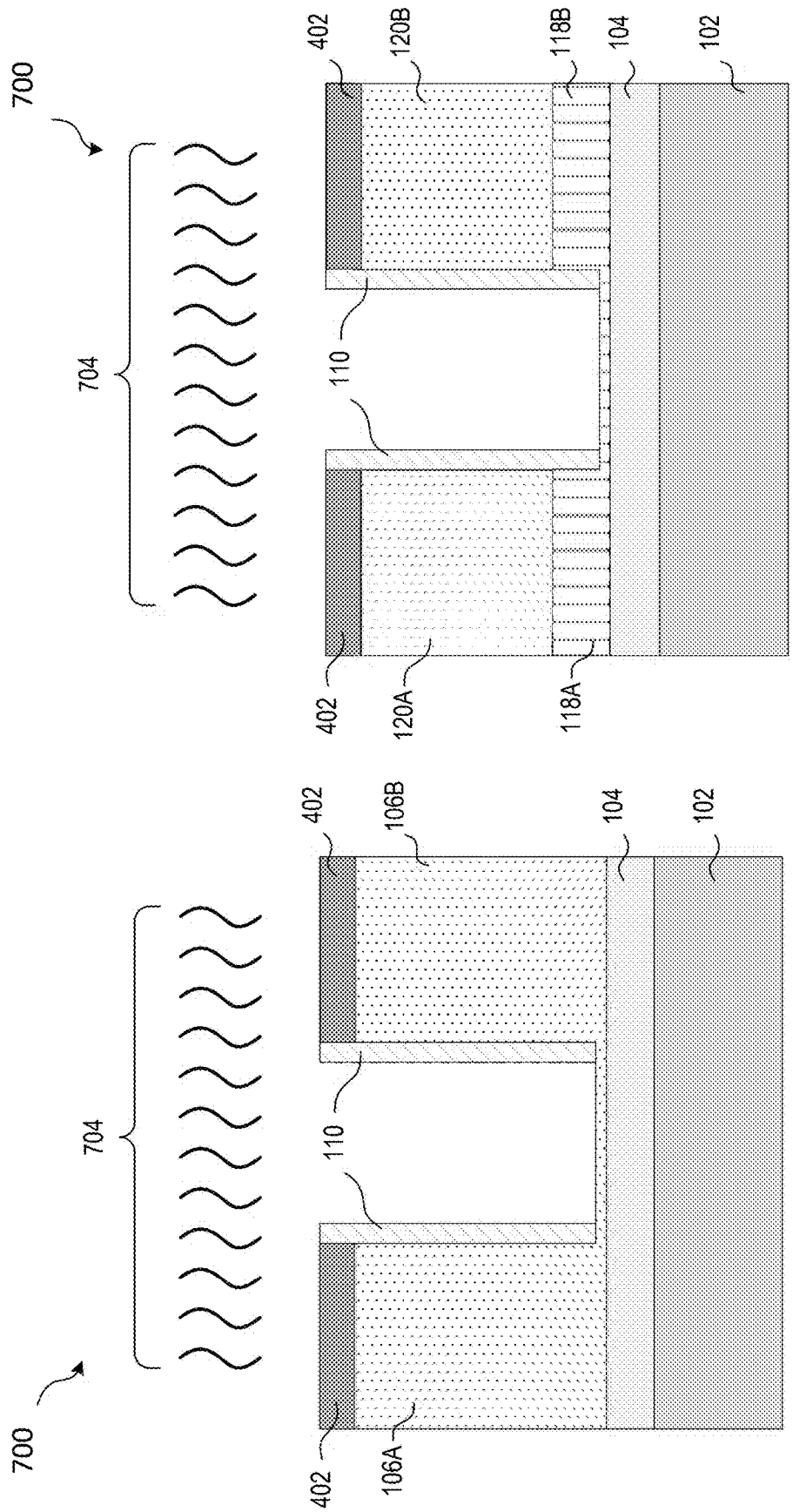
Figures 7C, 7D:
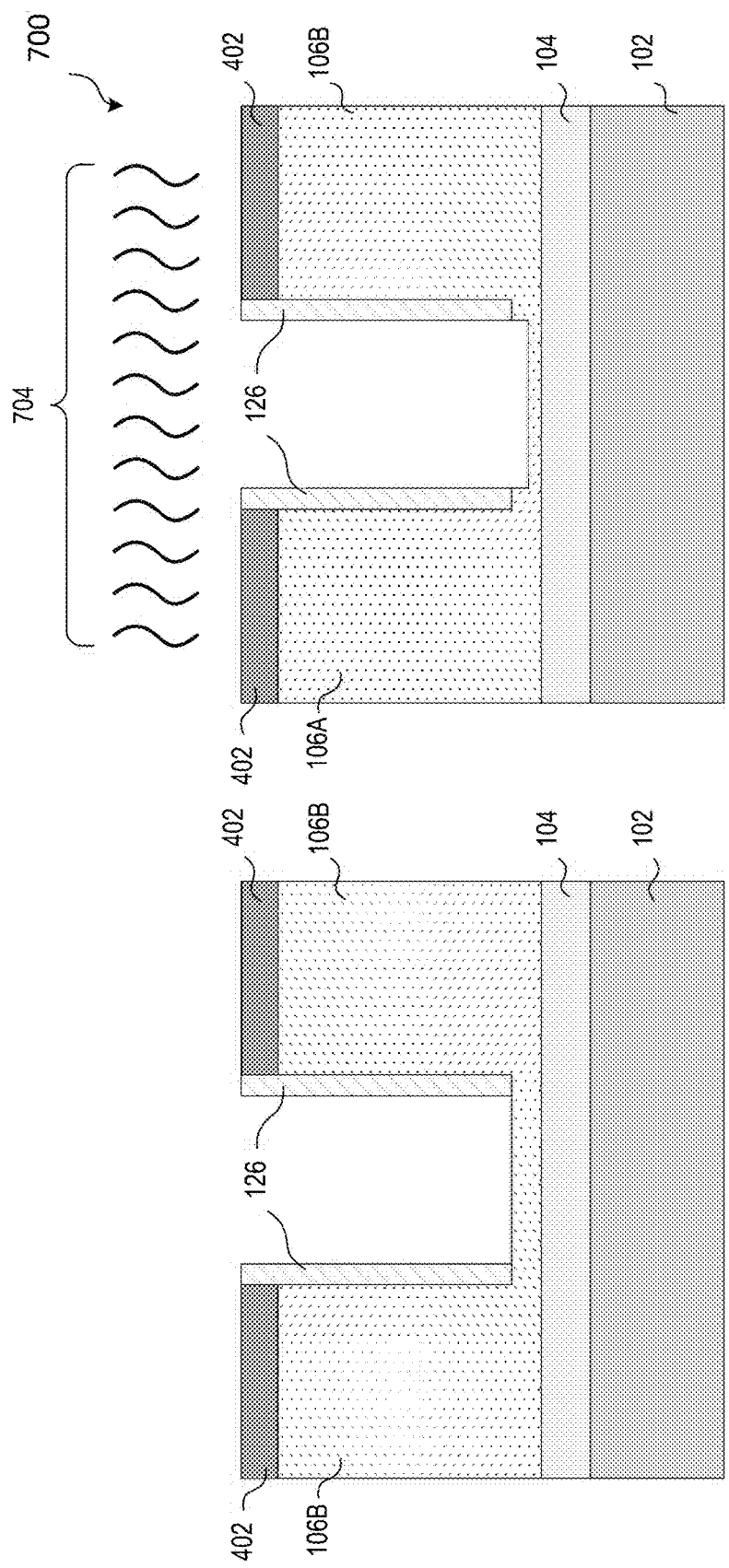

Referring to FIG. 2, in operation 210, portions of the spacer material layer outside the gate opening and on the bottom of the gate opening are removed. For example, as shown in FIGS. 7A-7C, in some embodiments, portions of spacer material layers 602 on top of hard mask layers 402 and at the bottom of gate openings 506 and 516 are removed, forming spacers 110 and 126, on the sidewalls of gate openings 506 and 516. Portions of spacer material layers 602 on top of hard mask layers 402 and on the bottom of gate openings 506 and 516 can be removed by a selective dry etch. The selective dry etch can be directional, and can etch spacer material layer 602 in the vertical direction along a Z-axis significantly more than in the horizontal direction along an X-axis. In some embodiments, the etching process is anisotropic—e.g., has a higher etching rate in the vertical direction (e.g., Z-axis) than in a lateral direction (e.g., X-axis). The dry etch process can be reactive ion etching process and can use a gas mixture having fluorocarbon ($C_xF_y$), $N_2$, and Ar. In some embodiments, the etching process can be a combination of chemical and physical etching. In some embodiments, the etching process can include multiple etching operations with different etching chemistries. The etchant(s) can be selected to have low selectivity towards hard mask layers 402 and metal layers 106 and 118. In some embodiments, the etching chemistry can be less selective towards hard mask layers 402 and metal layers 106 and 118, and highly selective towards the material in spacer material layers 602. The selectivity ratio between spacer material layer 602 and hard mask layer 402 or between spacer material layers 602 and metal layers 106 and 118 can be between about 2 and about 10. By way of example and not limitation, the etching selectivity ratio between spacer material layer 602 and hard mask layer 402 can be about 3:1 and the etching selectivity ratio between spacer material layers 602 and metal layers 106 and 118 can be about 10:1.

Referring to FIG. 2, in operation 212, optionally portions of the one or more metal layers at the bottom of the gate opening are removed. For example, as shown in FIG. 7D, in some embodiments, metal layer 106 is further removed with a second etch. The second etch can use a process substantially similar as the etch process used in forming gate openings 506 and 516. The second etch can be directional, selective, and/or timed. The two-step etching can form the thin metal layer at the bottom of gate opening 516 in a particular shape, e.g., staple-shaped. Additional etching steps can be used to form the thin metal layer in different shapes, e.g., semicircular, trapezoid, U-shaped, etc. Each etching step can use a same or a different etching technique, e.g., dry etch, wet etch, timed etch, directional etch, or selective etch.

Referring to FIG. 2, in operation 214, a 2D channel is formed at the bottom of the gate opening. For example, as described with reference to FIGS. 7A-7B, 7D, and 8A-8C, 2D channels 108, 122, and 124 are formed at the bottom of gate openings 506 and 516. As shown in FIGS. 7A, 7B, and 7D, in some embodiments, structures 700 are treated with chalcogen gas 704. Chalcogen gas 704 can include S- or Se-based gas, S or Se powder/gas, hydrogen sulfide ($H_2S$) or hydrogen selenide ($H_2Se$), hydrogen disulfide ($H_2S_2$) or hydrogen diselenide ($H_2Se_2$), dithienodisilacyclohexadiene (DTDS), di-tert-butyl sulfide (DTBS), diethyl sulfide (DES), etc. Chalcogen gas 704 can include hydrogen (H), chlorine (Cl), fluorine (F), etc. The treatment with chalcogen gas 704 ("chalcogen treatment") can be a CVD, a PECVD, or an ALD process with a pulse purge. The chalcogen treatment can be a CVD process with a continuous gas supply. The chalcogen treatment can be plasma-enhanced, e.g., inductively coupled plasma (ICP), capacitively coupled plasma (CCP), microwave, electron cyclotron resonance (ECR) plasma, etc. The power of the plasma enhancement can be between about 50 W and about 5000 W. The chalcogen treatment temperature can be between about 300° C. and about 800° C. with plasma enhancement or between about 500° C. and about 1100° C. without plasma enhancement. The flow rate of the chalcogen gas can be between about 0.5 sccm and about 10 sccm. The flow rate of the Ar or $N_2$ protective gas can be between about 5 sccm and about 1000 sccm. The flow rate of the hydrogen ($H_2$) plasma gas can be between about 0 sccm and about 100 sccm. The pressure of the processing chamber can be between about 1 Torr and about 10 Torr. The chalcogen treatment can last for a predetermined period of time based on the growth rate and the desired thickness of the 2D channel to be formed. Chalcogen gas 704 can be applied directionally. Hard mask layers 402 can protect the top surfaces of metal layer 106 and 120 from being treated with chalcogen gas 704. Spacers 110 and 126 can protect the sidewalls of metal layers 106 and 120 from being treated with chalcogen gas 704.

Figures 8A, 8B:
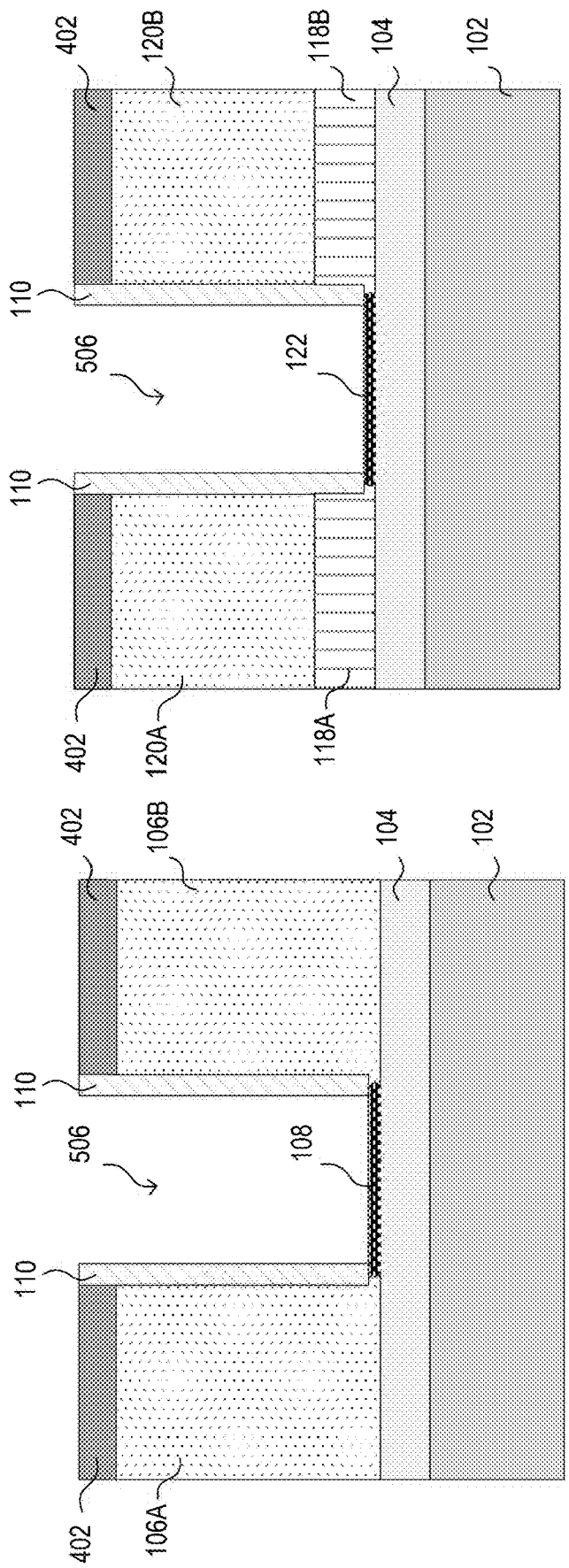
Figure 8C:
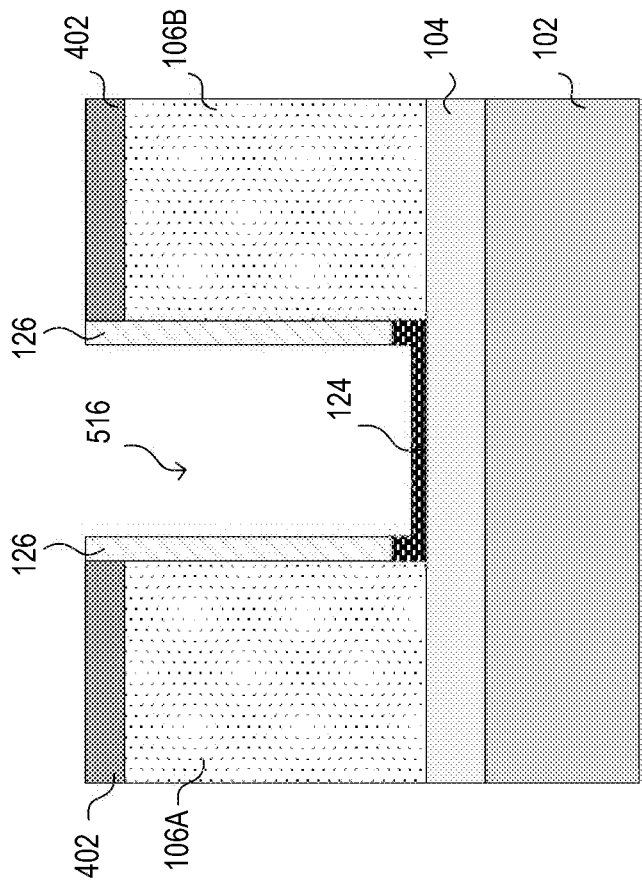

Referring to FIGS. 8A-8C, the chalcogen treatment can form a monolayer or multiple layers of chalcogen atoms on top of the thin metal layers in gate openings 506 and 516 which is the same material as metal layers 106 and 118. The monolayer or multiple layers of chalcogen atoms can diffuse within the thin metal layers and form 2D channels 108, 122, and 124 including TMC materials. The chalcogen treatment can generate a high mobility channel in the center of 2D channels 108, 122, and 124. The chalcogen treatment can generate LDDs under S/D regions 106A-106B and 118A-118B. The chalcogen treatment can further generate a gradient distribution of the TMC material at the two ends of the 2D channel, e.g., under spacers 110 or 126. The gradient distribution can realize a semiconductor-semimetal-metal WF transition from 2D channels 108, 122, and 124 to S/D regions 106A-106B and 118A-118B. The transition can reduce SBH, i.e., SBH tuning, between 2D channel 108 and S/D regions 106A-106B, between 2D channel 124 and S/D regions 106A-106B, and between 2D channel 122 and S/D regions 118A-118B to result in low contact resistance. The diffusion of chalcogen atoms into the thin metal layer can also create a continuous medium between the top and bottom surfaces of 2D channels 108, 122, and 124. The continuity can reduce the van der Waals gap between the top and bottom surfaces of 2D channels 108, 122, and 124, and further reduce the contact resistance.

Referring to FIG. 8B, 2D channel 122 can have a gradient contact with S/D regions 118A-118B resulting in low contact resistance. The metal-metal contact between S/D regions 118A-118B and 120A-120B does not substantially add to the contact resistance or substantially affect the overall contact resistance. Using two layers of metal can increase the flexibility in selecting S/D regions because there may be a limitation on the type of metal that can be treated with chalcogen atoms to form a 2D channel. Another advantage of using two layers of metal can be metal layer 118 may have a better adhesion to dielectric layer 104 than metal layer 120.

Referring to FIG. 8C, 2D channel 124 can be staple-shaped or in other shapes. The differently shaped 2D channel 124 can increase the contact area between 2D channel 124 and S/D regions 106A-106B, thus reducing the contact resistance.

Figures 9A, 9B:
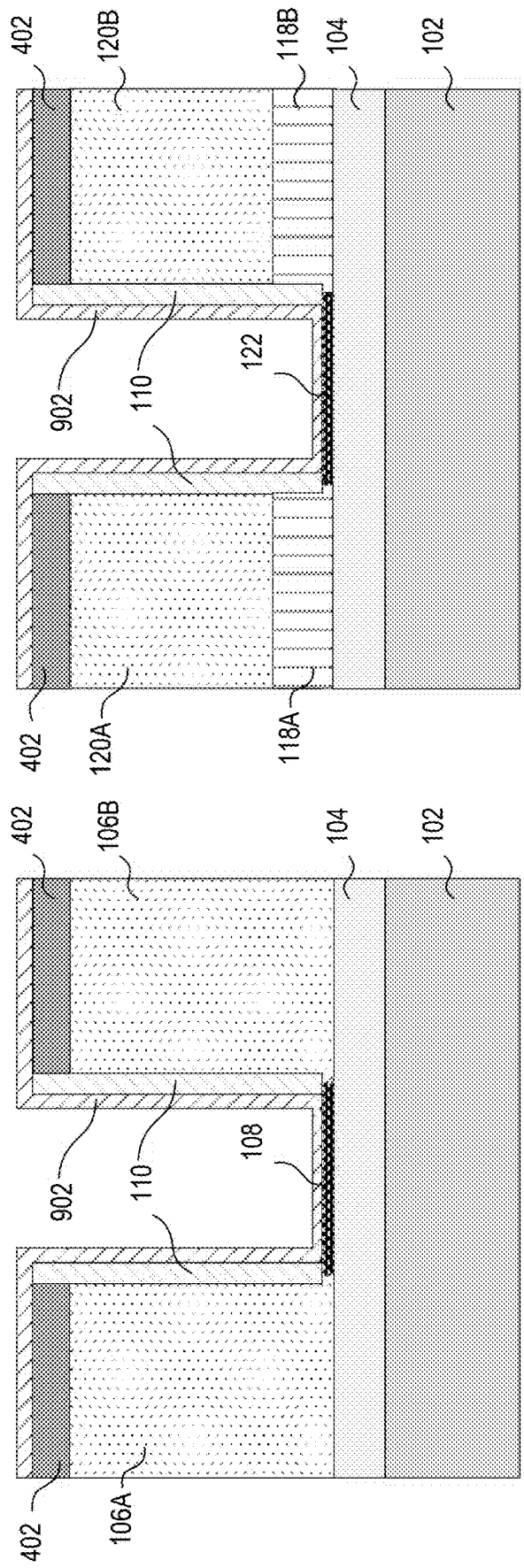
Figure 9C:
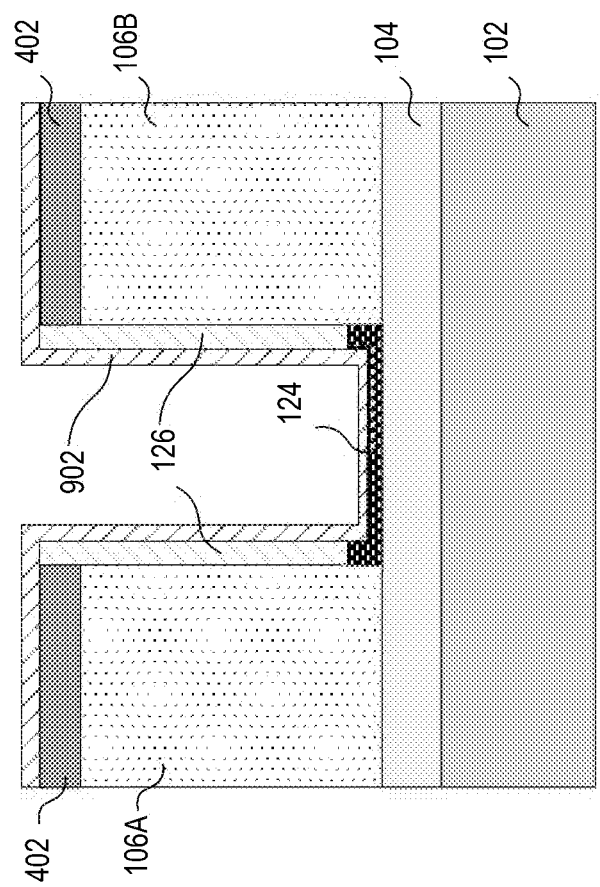

Referring to FIG. 2, in operation 216, a gate structure is formed in the gate opening. For example, as described with reference to FIGS. 9A-11C, gate structure 130 is formed. As shown in FIGS. 9A-9C, 10A-10C, and 11A-11C, in some embodiments, gate dielectric layers 902, WFM layers 1002, and filler metal layers 1102 are deposited in gate openings 506 and 516 on top of 2D channels 108, 122, and 124. Referring to FIGS. 9A-9C, gate dielectric layers 902 are formed on top of hard mask layers 402, on top of 2D channels 108, 122, and 124, and on sidewalls of spacers 110 and 126. Any suitable processes can be used to form gate dielectric layers 902. For example, gate dielectric layers 902 can be deposited using a PECVD, a CVD, a PVD, or an ALD process. Gate dielectric layers 902 can maintain the carrier mobility in 2D channel 108, 122, and 124.

Figure 10B:
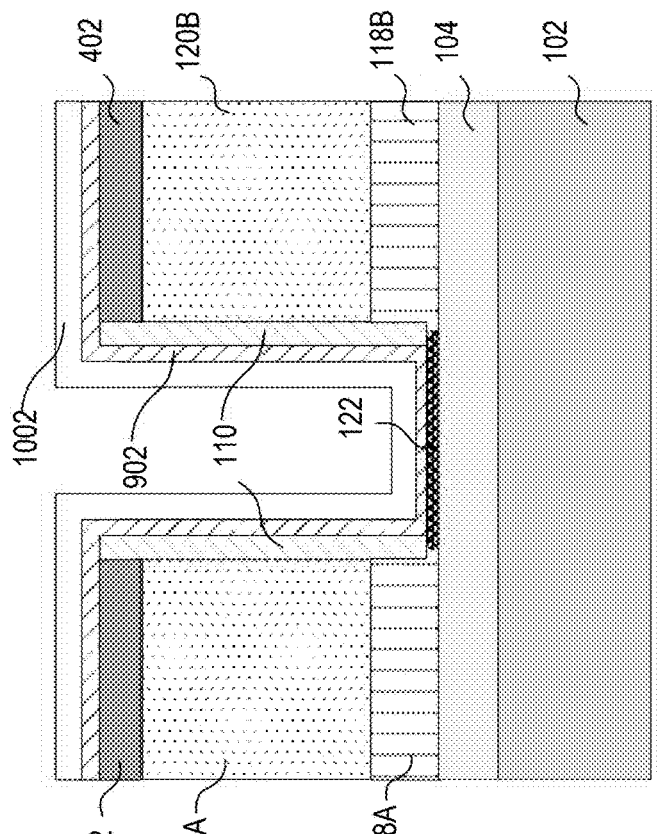
Figure 10A:
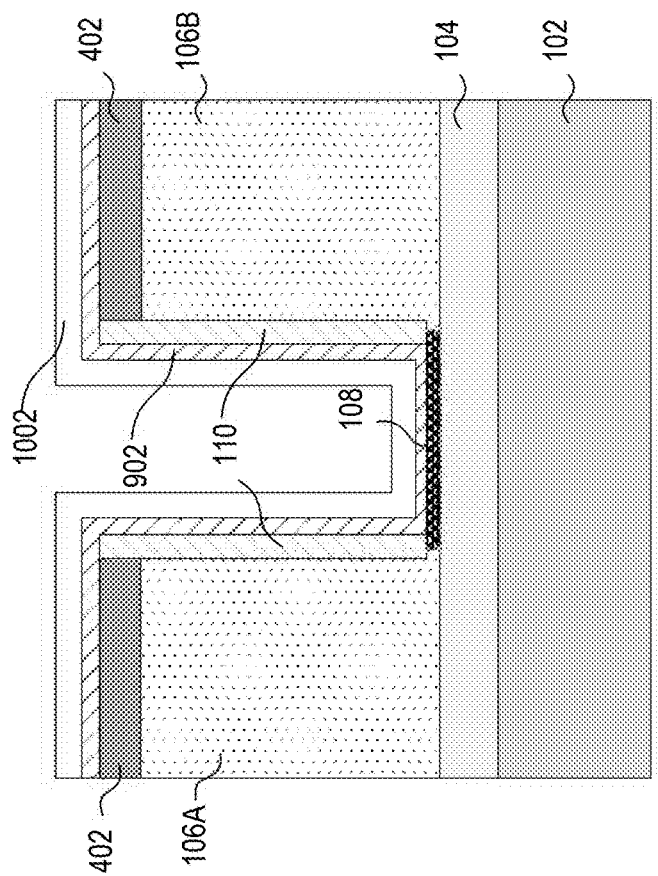
Figure 10C:
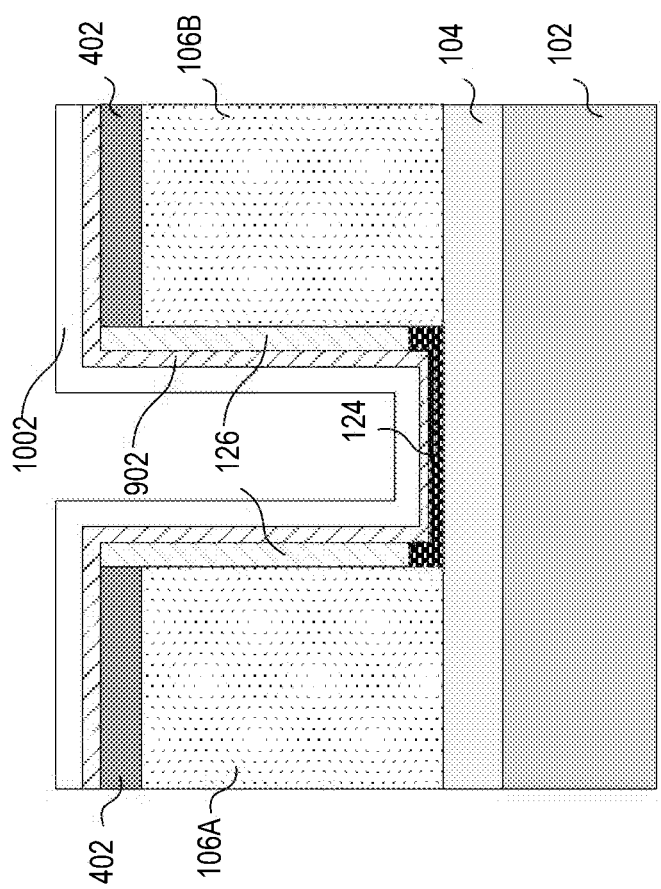

Referring to FIGS. 10A-10C, WFM layers 1002 are formed on top of gate dielectric layers 902. A WF is associated with the material composition of WFM layers 1002, and thus, the material of WFM layers 1002 can be chosen to tune its WF so that a desired threshold voltage $V_t$ is achieved. WFM layers 1002 can be formed by a PECVD, a CVD, a PVD, an ALD, or an MOCVD process, sputtering, other suitable deposition methods, or any combination thereof.

Figure 11B:
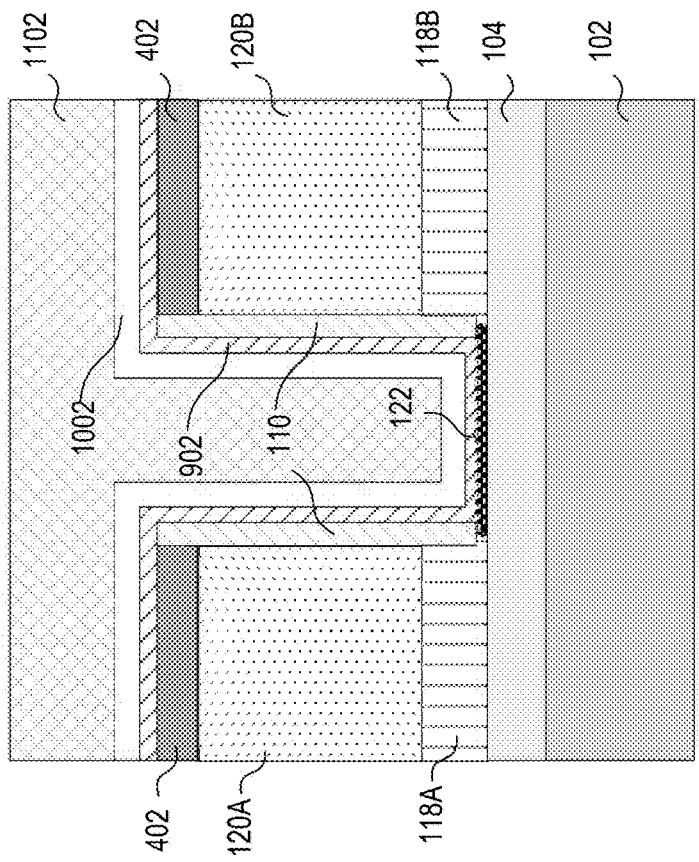
Figure 11A:
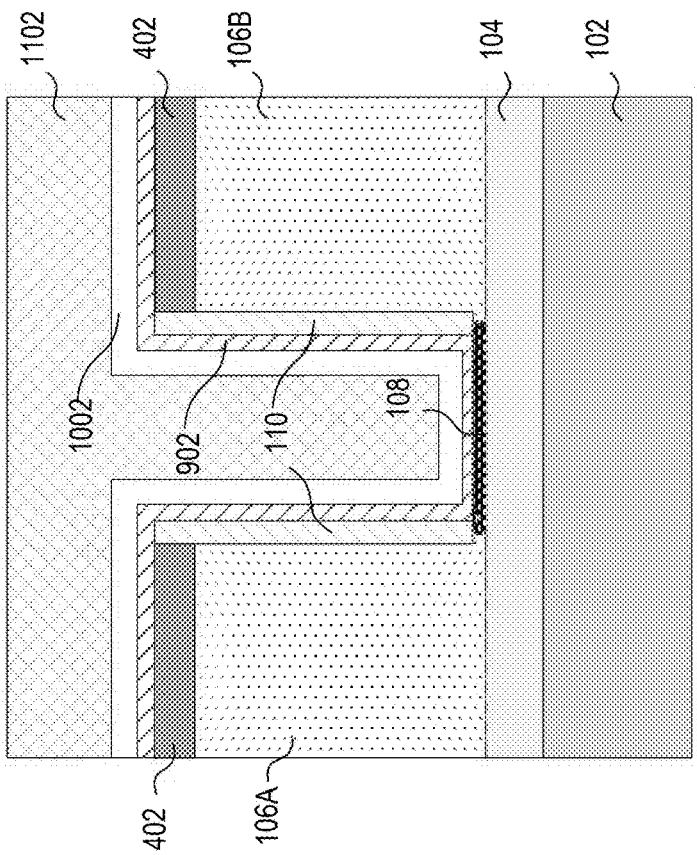
Figure 11C:
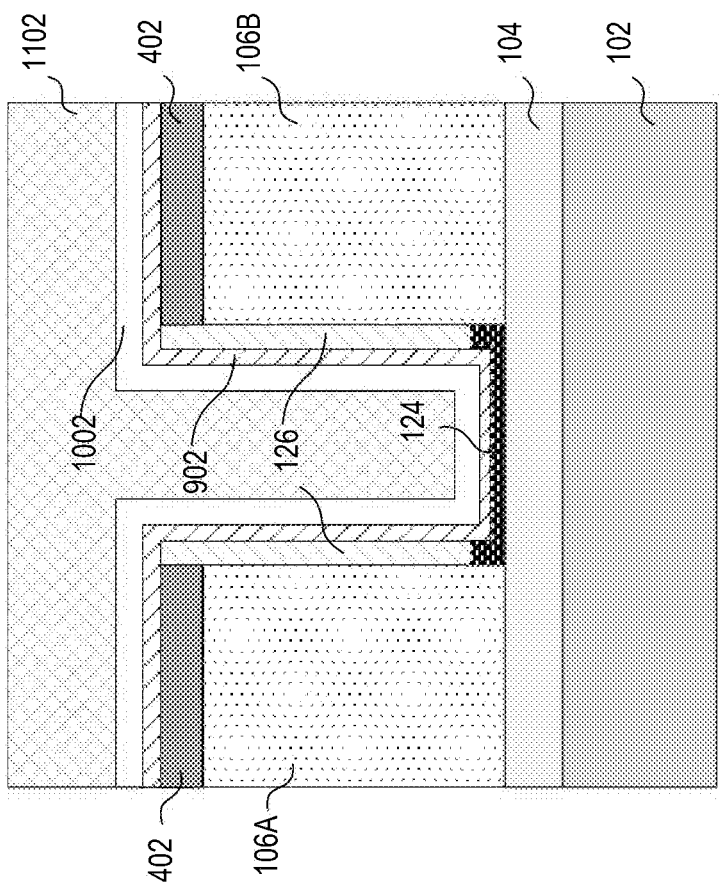

Referring to FIGS. 11A-11C, filler metal layers 1102 are formed on top of WFM layers 1002. Filler metal layers 1102 fill up the rest of space in gate openings 506 and 516. Filler metal layers 1102 can be formed by a PECVD, a CVD, a PVD, an ALD, or an MOCVD process, sputtering, other suitable deposition methods, or any combination thereof.

In some embodiments, filler metal layers 1102, WFM layers 1002, gate dielectric layers 902, spacers 110 and 126, and hard mask layers 402 are polished such that the above-described layers are substantially co-planar with metal layers 106 and 120. In some embodiments, after the above-described layers are formed, a planarization process, e.g., CMP, is used to remove the extra thickness of these layers over metal layers 106 and 120. In various embodiments, other planarization/etching process can also be used to reduce the above-described layers to be substantially coplanar.

Figure 12A:
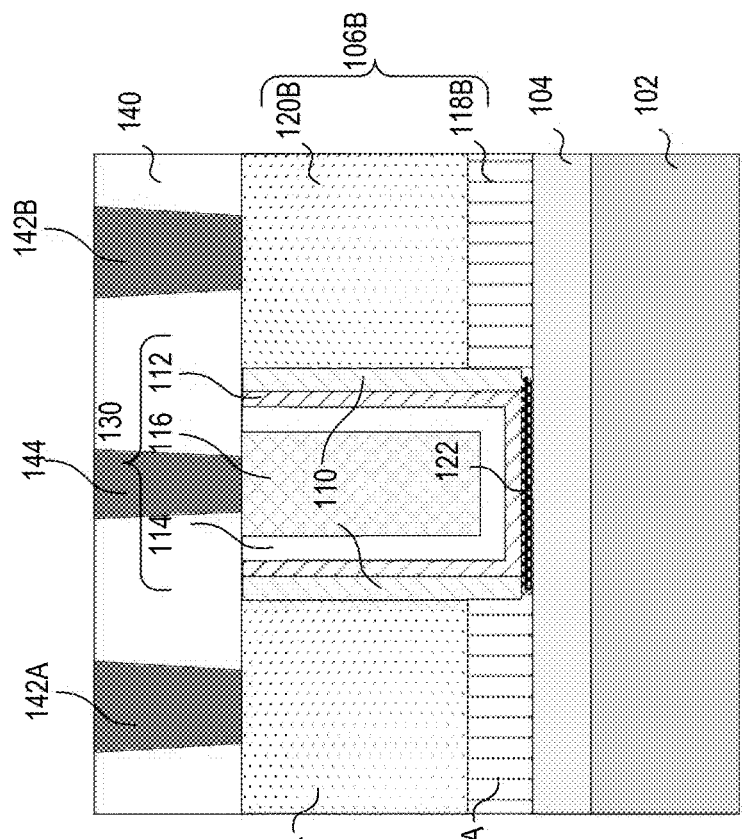
Figure 12B:
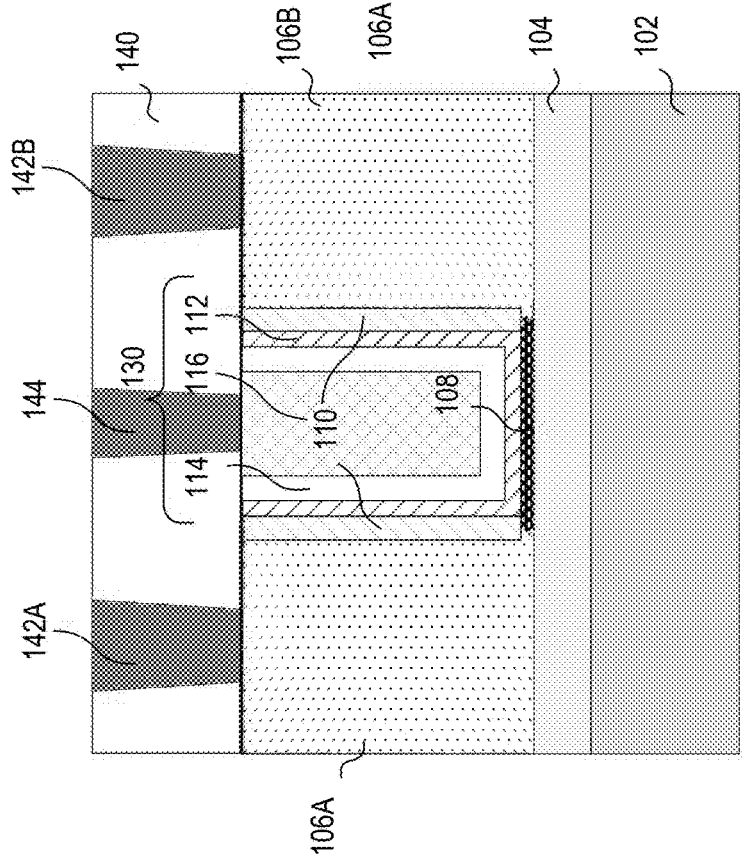
Figure 12C:
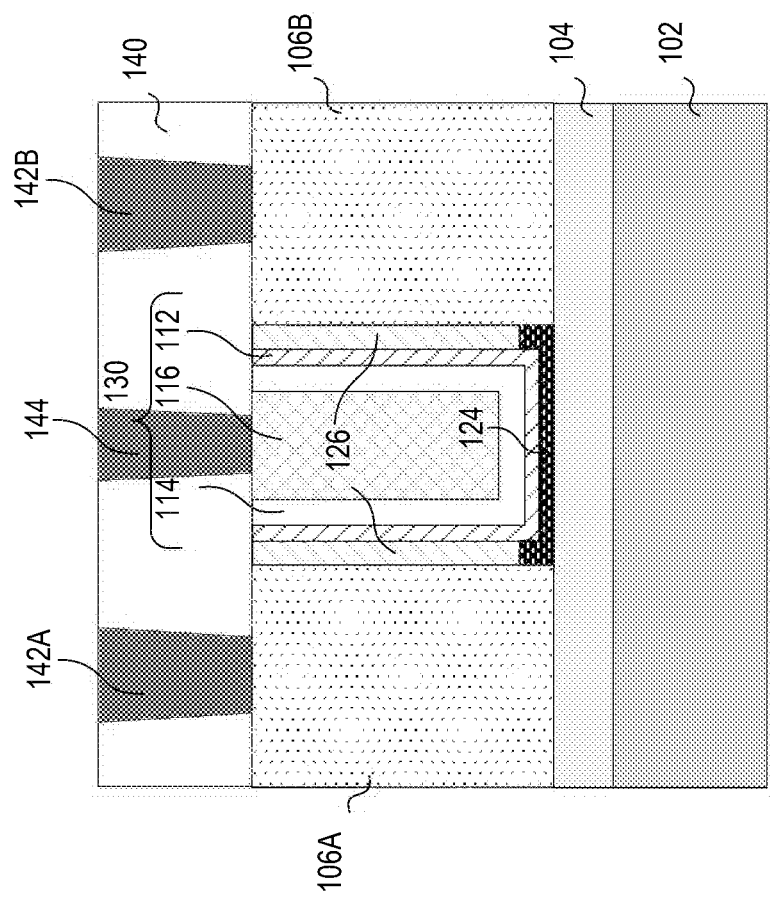

Referring to FIG. 2, in operation 218, contact structures are formed. For example, as described with reference to FIGS. 12A-12C, gate contact structure 144 and S/D contact structures 142A and 142B are formed. As shown in FIGS. 12A-12C, in some embodiments, ILD layer 140 can be deposited by a CVD process on gate structure 130, spacers 110, and S/D regions 106A-106B and 120A-120B. Contact openings can be formed in ILD layer 140 by a photolithographic patterning process and an etching process. The etching process can be a dry etching process, a wet etching process, or combinations thereof. Sidewalls of the contact openings can be substantially vertical or slanted. The locations, shapes, and sizes of the contact openings are for illustrative purposes only. A conductive metal can be deposited in the contact openings by a PECVD, a CVD, a PVD, an ALD, or an MOCVD process, sputtering, other suitable deposition methods, or any combination thereof. A planarization process, such as CMP, can be used to remove the extra thickness of the conductive metal to form contact structures 142A, 142B, and 144. After contact structures 142A, 142B, and 144 are formed, 2D channel FET 100 as shown in FIGS. 1A-1C are formed.

The present disclosure is directed to a 2D channel FET (e.g., 2D channel FET 100) with low contact resistance and a method (e.g., method 200) for forming such a structure using a channel last process. The channel last process means the channel is formed after the S/D regions are formed. In some embodiments, a gate opening (e.g., gate opening 506 or 516) is formed through a metal layer, e.g., Ti, W, or Mo, leaving a thin metal layer at the bottom of the gate opening. The thin metal layer is treated with a chalcogen material, e.g., S, Se, or Te, to form a 2D channel (e.g., 2D channel 108, 122, or 124). A TMC material can be formed in the 2D channel. The chalcogen treatment can generate a high mobility channel in the center of the 2D channel. The chalcogen treatment can generate LDDs under the S/D regions (e.g., S/D regions 106A-106B and 118A-118B). The chalcogen treatment can further generate a gradient distribution of the TMC material at the two ends of the 2D channel. The gradient distribution can realize a semiconductor-semi-metal-metal WF transition from the 2D channel to the S/D regions. The transition can reduce SBH, i.e., SBH tuning, between the 2D channel and the S/D regions to result in low contact resistance. The diffusion of chalcogen atoms into the thin metal layer can also reduce the van der Waals gap between the top and bottom surfaces of the 2D channel, and further reduce the contact resistance.

In some embodiments, the gate opening is formed with a two-step etching process, leaving a staple-shaped 2D channel. The staple-shaped 2D channel can increase the contact area between the 2D channel and the S/D regions, thus reducing the contact resistance. By using different etching step combinations, the 2D channel can be other shapes, e.g., semicircular, trapezoid, U-shaped, etc.

In some embodiments, two layers of metal can be used for the S/D regions. The 2D channel can have a gradient contact with the first metal layer resulting in low contact resistance. The metal-metal contact between the first metal layer and the second metal layer does not add to the contact resistance. Using two layers of metal can increase the flexibility in selecting S/D contact metal because there may be a limitation on the type of metal that can be treated with chalcogen to form the 2D channel.

In some embodiments, a method includes depositing a dielectric layer on a semiconductor substrate, depositing a metal layer on the dielectric layer, and depositing a hard mask layer on the metal layer. The method further includes forming a gate opening by removing a portion of the hard mask layer and a portion of the metal layer. The method further includes depositing a spacer material layer on sidewalls of the gate opening and forming a channel, the channel including a TMC layer, at a bottom of the gate opening. The method further includes forming a gate structure on the channel and in the gate opening and removing the hard mask layer.

In some embodiments, a method includes depositing a first metal layer on a dielectric layer disposed on a substrate, depositing a second metal layer on the first metal layer, and forming a gate opening by removing a portion of the first metal layer and a portion of the second metal layer. The method further includes depositing a spacer on sidewalls of the gate opening and forming a channel, the channel including a TMC layer, at a bottom of the gate opening and in the first metal layer. The method further includes forming a gate structure on the channel and in the gate opening, the gate structure including a gate dielectric layer, a WFM layer, and a filler metal layer.

In some embodiments, a structure includes a dielectric layer disposed on a substrate, S/D regions including a metallic material disposed on the dielectric layer, and a gate structure disposed between the S/D regions, where the gate structure includes a gate dielectric layer, a WFM layer, and a filler metal layer. The structure further includes a spacer interposed between each of the S/D regions and the gate structure and a channel including a TMC layer that connects the S/D regions and is in contact with the dielectric layer.

It is to be appreciated that the Detailed Description section, and not the Abstract of the Disclosure section, is intended to be used to interpret the claims. The Abstract of the Disclosure section can set forth one or more but not all possible embodiments of the present disclosure as contemplated by the inventor(s), and thus, are not intended to limit the subjoined claims in any way.

The foregoing disclosure outlines features of several embodiments so that those skilled in the art can better understand the aspects of the present disclosure. Those skilled in the art will appreciate that they can readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they can make various changes, substitutions, and alterations herein without departing from the spirit and scope of the present disclosure.

What is claimed is:

1. A method, comprising:
   depositing a dielectric layer on a semiconductor substrate;
   depositing a metal layer on the dielectric layer;
   depositing a hard mask layer on the metal layer;
   forming a gate opening by removing a portion of the hard mask layer and a first portion of the metal layer;
   depositing a spacer material layer on sidewalls of the gate opening;
   converting a second portion of the metal layer exposed at a bottom of the gate opening into a channel comprising a transition metal chalcogenide (TMC) layer;
   forming a gate structure on the channel and in the gate opening; and
   removing the hard mask layer.

2. The method of claim 1, further comprising:
   removing an other portion of the metal layer at the bottom of the gate opening prior to forming the channel.

3. The method of claim 1, wherein converting the second portion of the metal layer comprises:
   exposing the second portion of the metal layer below the gate opening to a chalcogen material-based gas or plasma at a temperature between about 300° C. and about 800° C.

4. The method of claim 1, wherein converting the second portion of the metal layer comprises:
   treating the bottom of the gate opening with a chalcogen material-based gas.

5. The method of claim 1, wherein converting the second portion of the metal layer comprises:
   forming a layer of sulfide, selenide, or telluride in the second portion of the metal layer at the bottom of the gate opening.

6. The method of claim 1, wherein converting the second portion of the metal layer comprises converting the second portion of the metal layer into a layer of tungsten sulfide ($WS_2$), tungsten selenide ($WSe_2$), molybdenum sulfide ($MoS_2$), molybdenum selenide ($MoSe_2$), or combinations thereof.

7. The method of claim 1, wherein the channel comprises a high mobility region at a center of the channel and a concentration profile of chalcogen atoms that decreases linearly or exponentially at ends of the channel.

8. The method of claim 1, wherein converting the second portion of the metal layer comprises converting the second portion of the metal layer into the TMC layer with a concentration profile of chalcogen atoms, the concentration profile comprising a radiating, semicircular, diamond, or elliptical pattern.

9. The method of claim 1, wherein converting the second portion of the metal layer comprises converting the second portion of the metal layer into the TMC layer with a rectangular, diamond, elliptical, staple-shaped, semicircular, trapezoidal, or U-shaped pattern.

10. The method of claim 1, wherein forming the gate structure comprises:
    forming a gate dielectric layer in the gate opening;
    forming a work function metal (WFM) layer on the gate dielectric layer; and
    forming a filler metal layer on the WFM layer.

11. A method, comprising:
    depositing a first metal layer on a dielectric layer disposed on a substrate;
    depositing a second metal layer on the first metal layer;
    forming a gate opening by removing a portion of the first metal layer and a portion of the second metal layer;
    depositing a spacer on sidewalls of the gate opening;
    converting a first portion of the first metal layer exposed at a bottom of the gate opening and a second portion of the first metal layer below the spacer into a channel comprising a transition metal chalcogenide (TMC) layer; and
    forming a gate structure on the channel and in the gate opening, wherein forming the gate structure comprises:
    depositing a gate dielectric layer;
    depositing a work function metal (WFM) layer; and
    depositing a filler metal layer.

12. The method of claim 11, further comprising:
    removing an other portion of the first metal layer at the bottom of the gate opening prior to forming the channel.

13. The method of claim 11, wherein the converting comprises:
    exposing the first portion of the first metal layer below the gate opening to a chalcogen material-based gas or plasma at a temperature between about 300° C. and about 800° C.

14. The method of claim 11, wherein the converting comprises:
    treating the bottom of the gate opening with a chalcogen material-based gas at a temperature between about 500° C. and about 1100° C. and without plasma.

15. The method of claim 11, wherein the converting comprises:
    forming a layer of sulfide, selenide, or telluride in the first metal layer.

16. The method of claim 11, wherein the converting comprises forming a layer of tungsten sulfide ($WS_2$), tungsten selenide ($WSe_2$), molybdenum sulfide ($MoS_2$), molybdenum selenide ($MoSe_2$), or combinations thereof in the first metal layer.

17. A method, comprising:
    forming a dielectric layer on a substrate;
    forming source/drain (S/D) regions comprising a metallic material on the dielectric layer;
    forming a gate opening between the S/D regions;
    forming spacers directly on sidewalls of the S/D regions exposed in the gate opening;
    forming a channel comprising a transition metal chalcogenide (TMC) layer that connects the S/D regions and is in contact with the dielectric layer; and
    forming a gate structure on the channel.

18. The method of claim 17, wherein forming the channel comprises forming the channel with a mobility region at a center of the channel and a concentration profile of chalcogen atoms that decreases linearly or exponentially at ends of the channel.

19. The method of claim 17, wherein forming the channel comprises forming a layer of sulfide, selenide, or telluride in the gate opening.

20. The method of claim 17, wherein forming the channel comprises forming the channel with a rectangular, diamond, elliptical, staple-shaped, semicircular, trapezoidal, or U-shaped cross-sectional profile.

* * * * *